(12) United States Patent
Hamaguchi et al.

(10) Patent No.: US 10,199,800 B2
(45) Date of Patent: Feb. 5, 2019

(54) LIGHT EMITTING ELEMENT
(71) Applicant: Sony Corporation, Tokyo (JP)
(72) Inventors: Tatsushi Hamaguchi, Kanagawa (JP); Shoichiro Izumi, Kanagawa (JP); Yoshiro Takiguchi, Kanagawa (JP); Noriyuki Futagawa, Kanagawa (JP)
(73) Assignee: Sony Corporation, Tokyo (JP)
( * ) Notice: Subject to any disclaimer, the term of this patent is extended or adjusted under 35 U.S.C. 154(b) by 0 days.
(21) Appl. No.: 15/739,853
(22) PCT Filed: May 11, 2016
(86) PCT No.: PCT/JP2016/063944
§ 371 (c)(1),
(2) Date: Dec. 26, 2017
(87) PCT Pub. No.: WO2017/018017
PCT Pub. Date: Feb. 2, 2017
(65) Prior Publication Data
US 2018/0366906 A1 Dec. 20, 2018
(30) Foreign Application Priority Data Jul. 28, 2015 (JP) .................... 2015-148393

(51) Int. Cl.
*H01S 5/18* (2006.01)
*H01S 5/183* (2006.01)
(Continued)
(52) U.S. Cl.
CPC .......... *H01S 5/18308* (2013.01); *H01S 5/028* (2013.01); *H01S 5/0421* (2013.01); *H01S 5/0425* (2013.01); *H01S 5/2004* (2013.01)
(58) Field of Classification Search
CPC .... H01S 5/18308; H01S 5/028; H01S 5/0421; H01S 5/0425; H01S 5/2004; H01S 5/065; H01S 5/0651; H01S 5/0653
See application file for complete search history.

(56) References Cited

U.S. PATENT DOCUMENTS

2015/0044795 A1 2/2015 Futagawa et al.
2015/0357795 A1 12/2015 Futagawa et al.

FOREIGN PATENT DOCUMENTS

JP 2011151364 4/2011
JP 2015-35543 A 2/2015

OTHER PUBLICATIONS

International Search Report dated Feb. 2, 2017 in corresponding international application No. PCT/JP2016/063944 (2 pages).

(Continued)

*Primary Examiner* — Armando Rodriguez
(74) *Attorney, Agent, or Firm* — K&L Gates LLP

(57) ABSTRACT

A light emitting element includes a stacked structure 20 in which a first compound semiconductor layer 21, an active layer 23 and a second compound semiconductor layer 22 made of GaN-based compound semiconductors are stacked, a mode loss acting portion 54 provided on the second compound semiconductor layer 22 and configuring a mode loss acting region 55 that acts upon increase or decrease of oscillation mode loss, a second electrode 32, a second light reflection layer 42, a first light reflection layer 41, and a first electrode 31. A current injection region 51, a current non-injection inner side region 52 that surrounds the current injection region 51 and a current non-injection outer side region 53 that surrounds the current non-injection inner side region 52 are formed on the stacked structure 20, and a projection image of the mode loss acting region 55 and a projection image of the current non-injection outer side region 53 overlap with each other.

20 Claims, 11 Drawing Sheets

(51) Int. Cl.
*H01S 5/028* (2006.01)
*H01S 5/042* (2006.01)
*H01S 5/20* (2006.01)

(56) References Cited

OTHER PUBLICATIONS

Written Opinion dated Feb. 2, 2017 in corresponding international application No. PCT/JP2016/063944 (3 pages).

LIGHT EMITTING ELEMENT

CROSS-REFERENCE TO RELATED APPLICATIONS

The present application claims the benefit of International Application No. PCT/JP2016/063944, filed May 11, 2016, which claims priority to Japanese Application No. 2015-148393, filed Jul. 28, 2015, the disclosures of which are incorporated herein by reference.

BACKGROUND

The present disclosure relates to a light emitting element (particularly, a surface emission laser element sometimes called vertical resonator laser or VCSEL).

Generally in a light emitting element configured from a surface emission laser element, laser oscillation occurs by causing laser light to resonate between two light reflection layers (Distributed Bragg Reflector layers, DBR layers). In a surface emission laser element having a structure in which an n-type GaN-based compound semiconductor, an active layer (light emitting layer) configured from a GaN-based compound semiconductor and a p-type GaN-based compound semiconductor are stacked, generally a second electrode made of a transparent conductive material is formed on a p-type compound semiconductor layer and a second light reflection layer configured from a stacked structure of an insulating material is formed on the second electrode. Further, a first electrode and a first light reflection layer configured from a stacked structure of an insulating material are formed on an n-type compound semiconductor layer. It is to be noted that, for the convenience of description, an axial line passing the center of a resonator formed from two light reflection layers is referred to as Z axis, and a virtual plane orthogonal to the Z axis is referred to as XY plane.

Incidentally, in a surface emission laser element, in order to control the flow path (current injection region) of current that flows between the first electrode and the second electrode, a current non-injection region is formed so as to surround a current injection region.

In a surface emission laser element configured from a GaAs-based compound semiconductor, the current non-injection region surrounding the current injection region can be formed by oxidizing the active layer from the outside along the XY plane. The refractive index decreases in the oxidized region of the active layer (current non-injection region) in comparison with a region that is not oxidized (current injection region). As a result, the optical path length (represented by a product of a refractive index and a physical distance) of the resonator in the current non-injection region becomes shorter than that in the current injection region. This gives rise to a kind of "lens effect" and brings about an action for confining laser light at a central portion of the surface emission laser element. Since light generally tends to spread by a diffraction effect, laser light that reciprocates in the resonator gradually dissipates to the outside of the resonator (diffraction loss), and this has a bad influence such as increase of threshold value current or the like. However, since the lens effect compensates for the diffraction loss, increase of threshold value current or the like can be suppressed.

However, in a surface emission laser element configured from a GaN-based compound semiconductor, it is difficult to oxidize the active layer from the outside (from a lateral direction) along the XY plane from the characteristics of the material. Therefore, an insulating layer made of $SiO_2$ and having an opening is formed on the p-type compound semiconductor layer, and a second electrode made of a transparent conductive material is formed over a region from the second compound semiconductor layer exposed to the bottom of the opening to the insulating layer. Further, the second light reflection layer configured from a stacked structure of an insulating material is formed on the second electrode (for example, refer to JP 2011-151364A). The current non-injection region is formed by forming the insulating layer in this manner. Further, a portion of the compound semiconductor layer provided on the insulating layer and positioned in the opening is utilized as the current injection region.

CITATION LIST

Patent Literature

[PTL 1]
JP 2011-151364A

SUMMARY

Where an insulating layer is formed on the p-type compound semiconductor layer, the length of the resonator in the region in which the insulating layer is formed (current non-injection region) is greater than the length of the resonator in the region in which the insulating layer is not formed (current injection region) by a length equal to the optical thickness of the insulating layer. Therefore, an action occurs that laser light reciprocating in the resonator formed from the two light reflection layers of the surface emission laser element (light emitting element) is diverged and dissipated to the outside of the resonator. Such an action as just described is referred to as "inverse lens effect" for the convenience of description. As a result, a greater amount of oscillation mode loss occurs with the laser light, and this increases the threshold value current or degrades the slope efficiency. Here, the "oscillation mode loss" indicates a physical quantity that provides increase or decrease to the light field intensities of a basic mode and a higher mode in the laser light to be oscillated, and different oscillation mode losses are defined for individual modes. It is to be noted that the "light field intensity" is a light field intensity where the distance L from the Z axis on the XY plane is a function. Generally, although, in the basic mode, the light field intensity degrades monotonously as the distance L increases, in the higher mode, the light field intensity finally decreases while increase or decrease is repeated once or by a plural number of times as the distance L increases (refer to a conceptual view of (A) of FIG. 11). It is to be noted that, in FIG. 11, a solid line curve indicates a light field intensity distribution of the basic mode and a broken line curve indicates a light field intensity distribution of the higher mode.

Accordingly, it is an object of the present disclosure to provide a light emitting element having a configuration or structure capable of placing the oscillation mode loss into a desired state.

In order to attain the object described above, according to a first mode of the present disclosure, there is provided a light emitting element, including:

(A) a stacked structure configured by stacking a first compound semiconductor layer made of a GaN-based compound semiconductor and having a first face and a second face that opposes to the first face, an active layer made of a GaN-based compound semiconductor and contacting with the second face of the first compound semiconductor layer, and a second compound semiconductor layer made of a GaN-based compound semiconductor, having a first face and a second face that opposes to the first face and contacting at the first face thereof with the active layer;

(B) a mode loss acting portion provided on the second face of the second compound semiconductor layer and configuring a mode loss acting region that acts upon increase or decrease of oscillation mode loss;

(C) a second electrode formed over a region from the second face of the second compound semiconductor layer to the mode loss acting portion;

(D) a second light reflection layer formed on the second electrode;

(E) a first light reflection layer formed on the first face of the first compound semiconductor layer; and (F) a first electrode electrically connected to the first compound semiconductor layer, in which a current injection region, a current non-injection inner side region that surrounds the current injection region and a current non-injection outer side region that surrounds the current non-injection inner side region are formed on the stacked structure, and a projection image of the mode loss acting region and a projection image of the current non-injection outer side region overlap with each other.

In order to attain the object described above, according to a second mode of the present disclosure, there is provided a light emitting element, including:

(a) a stacked structure configured by stacking a first compound semiconductor layer made of a GaN-based compound semiconductor and having a first face and a second face that opposes to the first face, an active layer made of a GaN-based compound semiconductor and contacting with the second face of the first compound semiconductor layer, and a second compound semiconductor layer made of a GaN-based compound semiconductor, having a first face and a second face that opposes to the first face and contacting at the first face thereof with the active layer;

(b) a second electrode formed on the second face of the second compound semiconductor layer;

(c) a second light reflection layer formed on the second electrode;

(d) a mode loss acting portion provided on the first face of the first compound semiconductor layer and configuring a mode loss acting region that acts upon increase or decrease of oscillation mode loss;

(e) a first light reflection layer formed over a region from the first face of the first compound semiconductor layer to the mode loss acting portion; and (f) a first electrode electrically connected to the first compound semiconductor layer, in which a current injection region, a current non-injection inner side region that surrounds the current injection region and a current non-injection outer side region that surrounds the current non-injection inner side region are formed on the stacked structure, and a projection image of the mode loss acting region and a projection image of the current non-injection outer side region overlap with each other.

Advantageous Effects of Invention

In the light emitting elements according to the first mode and second mode of the present disclosure, the current injection region, current non-injection inner side region surrounding the current injection region and current non-injection outer side region surrounding the current non-injection inner side region are formed on the stacked structure, and a projection image of the mode loss acting region and a projection image of the current non-injection outer side region overlap with each other. In other words, the current injection region and the mode loss acting region are spaced from each other by the current non-injection inner side region (separated from each other). Therefore, a positional relationship between the current injection region and the mode loss acting region, the thickness of the mode loss acting portion configuring the mode loss acting region and so forth are determined suitably such that increase or decrease of the oscillation mode loss can be placed into a desired state. As a result, for example, a problem of a conventional light emitting element that threshold value current increases or a slope efficiency decreases can be solved. Besides, since control of the oscillation mode loss and control of the light emission state of the light emitting element can be performed independently of each other, the degree of freedom in control and the degree of freedom in design of a light emitting element can be increased. It is to be noted that the effects described in the present specification are illustrative in the end and are not limited to them, and there may be an additional effect.

Figure 11:
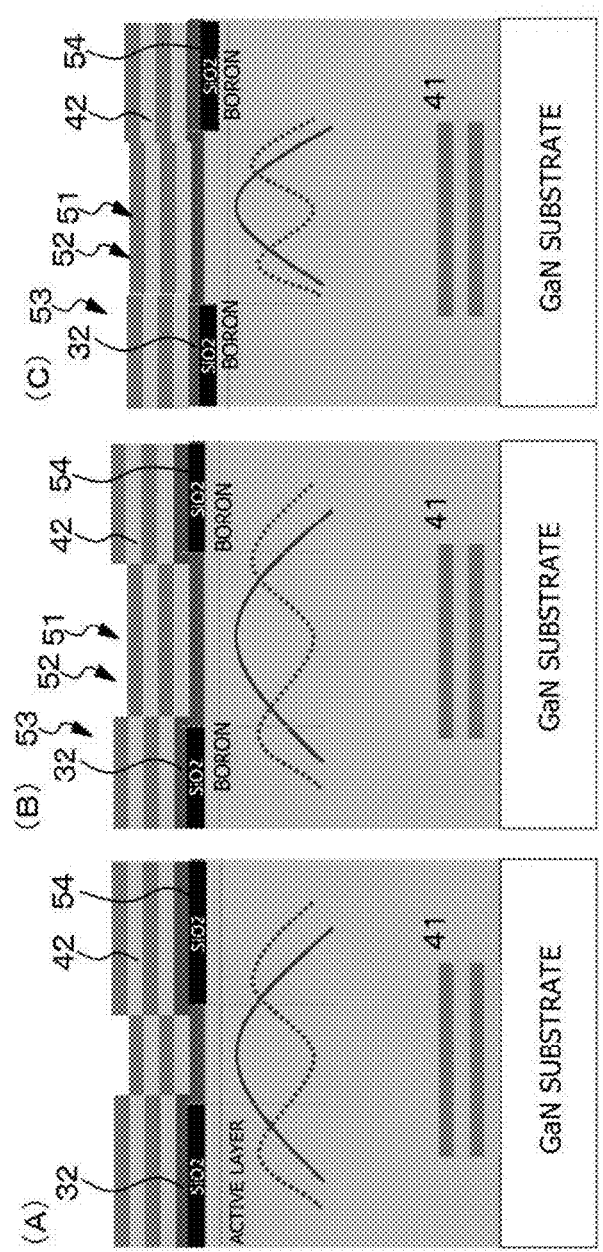

(A), (B) and (C) of FIG. 11 are conceptual views depicting light field intensities of a conventional light emitting element, the light emitting element of the working example 1 and the light emitting element of the working example 4.

DETAILED DESCRIPTION

In the following, the present disclosure is described on the basis of working examples with reference to the drawings. However, the present disclosure is not limited to the working examples, and various numerical values and materials in the working examples are illustrative. It is to be noted that the description is given in the following order.

1. General description of light emitting elements according to first and second modes of present disclosure
2. Working example 1 (light emitting element according to first mode of present disclosure)
3. Working example 2 (modification to working example 1)
4. Working example 3 (modification to working examples 1 and 2)
5. Working example 4 (modification to working examples 1 to 3)
6. Working example 5 (modification to working examples 1 to 4)
7. Working example 6 (light emitting element according to second mode of present disclosure)
8. Others <General Description of Light Emitting Elements According to First and Second Modes of Present Disclosure>

In the light emitting elements according to the first mode and the second mode of the present disclosure, although a current non-injection region (general term of current non-injection inner side region and current non-injection outer side region) is formed on a stacked structure, particularly the current non-injection region may be formed in a region at a second electrode side of a second compound semiconductor layer in the thicknesswise direction or may be formed on the overall second compound semiconductor layer. Alternatively, the current non-injection region may be formed on the second compound semiconductor layer and an active layer or may be formed over a region from the second compound semiconductor layer to part of a first compound semiconductor layer. While a projection image of a mode loss acting region and a projection image of the current non-injection outer side region overlap with each other, in a region sufficiently spaced from the current injection region, the projection image of the mode loss acting region and the projection image of the current non-injection outer side region may not overlap with each other.

The light emitting element according to the first mode of the present disclosure can be formed such that the current non-injection outer side region is positioned below the mode loss acting region.

The light emitting element according to the first mode of the present disclosure including the preferred modes described above can be formed such that, where the area of the projection image of the current injection region is represented by $S_1$ and the area of the projection image of the current non-injection inner side region is represented by $S_2$, $$0.01 \le S_1/(S_1+S_2) \le 0.7$$

is satisfied. Meanwhile, the light emitting element according to the second mode of the present disclosure can be formed such that, where the area of the projection image of the current injection region is represented by $S_1'$ and the area of the projection image of the current non-injection inner side region is represented by $S_2'$, $$0.01 \le S_1'/(S_1'+S_2') \le 0.7$$

is satisfied. However, the range of $S_1/(S_1'+S_2)$ and the range of $S_1'/(S_1'+S_2')$ are not limited or restricted to the ranges described above.

The light emitting elements according to the first and second modes of the present disclosure including the preferred modes described above can be configured such that the current non-injection inner side region and the current non-injection outer side region are formed by ion injection into the stacked structure. A light emitting element having such a configuration as just described is referred to as "light emitting element according to the 1-Ath mode of the present disclosure" or "light emitting element according to the 2-Ath mode of the present disclosure" for the convenience of description, respectively. In this case, the light emitting elements can be configured such that the ion species is at least one selected from a group including boron, proton, phosphorus, arsenic, carbon, nitrogen, fluorine, oxygen, germanium and silicon.

Alternatively, the light emitting elements according to the first and second modes of the present disclosure including the preferred modes described above can be configured such that the current non-injection inner side region and the current non-injection outer side region can be formed by plasma irradiation upon the second face of the second compound semiconductor layer, an ashing process for the second face of the second compound semiconductor layer or a reactive ion etching process for the second face of the second compound semiconductor layer. A light emitting element having such a configuration as just described is referred to as "light emitting element according to the 1-Bth mode of the present disclosure" or "light emitting element according to the 2-Bth mode of the present disclosure" for the convenience of description, respectively. Since, in the processes described above, the current non-injection inner side region and the current non-injection outer side region are exposed to plasma particles, degradation occurs with the conductivity of the second compound semiconductor layer, and consequently, the current non-injection inner side region and the current non-injection outer side region are placed into a high-resistance state. In particular, the light emitting elements can be configured such that the current non-injection inner side region and the current non-injection outer side region are formed by exposure of the second face of the second compound semiconductor layer to plasma particles. For the plasma particles, argon, oxygen, nitrogen and so forth can be used particularly.

Alternatively, the light emitting elements according to the first and second modes of the present disclosure including the preferred modes described above can be configured such that a second light reflection layer has a region that reflects or scatters light from a first light reflection layer toward the outer side of a resonator structure configured from the first light reflection layer and the second light reflection layer. The light emitting element having such a configuration as just described is referred to as "light emitting element according to the 1-Cth mode of the present disclosure" or "light emitting element according to the 2-Cth mode of the present disclosure" for the convenience of description, respectively. In particular, the region of the second light reflection layer positioned above a side wall of a mode loss acting portion (side wall of an opening provided at the mode loss acting portion) has a forwardly tapering inclination or has a region curved projectingly toward the first light reflection layer. Alternatively, the light emitting elements according to the first and second modes of the present disclosure including the preferred modes described above can be configured such that the first light reflection layer has a region that reflects or scatters light from the second light reflection layer toward the outer side of the resonator structure configured from the first light reflection layer and the second light reflection layer. A light emitting element having such a configuration as just described is referred to as "light emitting element according to the 1-C'th mode of the present disclosure" or "light emitting element according to the 2-C'th mode of the present disclosure" for the convenience of description, respectively. In particular, in the light emitting element according to the 1-C'th mode of the present disclosure, a forwardly tapering inclination may be formed or a curved portion projected toward the second light reflection layer may be formed in a region of part of the first light reflection layer. Alternatively, in the light emitting element according to the 2-C'th mode of the present disclosure, a region of the first light reflection layer positioned above the side wall of the mode loss acting portion (side wall of an opening provided at a mode loss acting portion) has a forwardly tapering inclination or has a region curved projectingly toward the second light reflection layer. Also it is possible to configure the light emitting elements according to the first and second modes of the present disclosure including the preferred modes described above such that, by scattering light at the boundary (side wall edge portion) between a top face of the mode loss acting portion and the side wall of the opening provided at the mode loss acting portion, the light is scattered toward the outer side of the resonator structure configured from the first light reflection layer and the second light reflection layer.

The light emitting element according to the 1-Ath mode of the present disclosure, the 1-Bth mode of the present disclosure or the 1-Cth mode of the present disclosure described above can be configured such that, where the optical distance from the active layer in the current injection region to the second face of the second compound semiconductor layer is represented by $L_2$ and the optical distance from the active layer in the mode loss acting region to the top face of the mode loss acting portion is represented by $L_0$, $$L_0 > L_2$$

is satisfied. Further, the light emitting element according to the 2-Ath mode of the present disclosure, the 2-Bth mode of the present disclosure or the 2-Cth mode of the present disclosure described above can be configured such that, where the optical distance from the active layer in the current injection region to the first face of the first compound semiconductor layer is represented by $L_1'$ and the optical distance from the active layer in the mode loss acting region to the top face of the mode loss acting portion is represented by $L_0'$, $$L_0' > L_1'$$

is satisfied. Furthermore, the light emitting element according to the 1-Ath mode of the present disclosure, the 2-Ath mode of the present disclosure, the 1-Bth mode of the present disclosure, the 2-Bth mode of the present disclosure, the 1-Cth mode of the present disclosure or the 2-Cth mode of the present disclosure described above including the configurations described above can be configured such that generated light having a higher mode is dissipated toward the outer side of the resonator structure, which is configured from the first light reflection layer and the second light reflection layer, by the mode loss acting region, whereby the oscillation mode loss is increased. In particular, although the light field intensities of the basic mode and the higher mode to be generated decrease, by the presence of the mode loss acting region that acts upon increase or decrease of the oscillation mode loss, as the distance from the Z axis increases in a projection image of the mode loss acting region, the mode loss of the higher mode is more than decrease of the light field intensity of the basic mode, and consequently, the basic mode can be stabilized further. Further, since the mode loss can be suppressed in comparison with that in an alternative case in which the current injection inner side region does not exist, reduction of the threshold value current can be anticipated.

Further, the light emitting element according to the 1-Ath mode of the present disclosure, the 2-Ath mode of the present disclosure, the 1-Bth mode of the present disclosure, the 2-Bth mode of the present disclosure, the 1-Cth mode of the present disclosure or the 2-Cth mode of the present disclosure described above can be configured such that the mode loss acting portion is configured from a dielectric material, a metal material or an alloy material. As the dielectric material, $SiO_X$, $SiN_X$, $AlN_X$, $AlO_X$, $TaO_X$ and $ZrO_X$ can be exemplified, and as the metal material or the alloy material, titanium, gold, platinum and alloys of them can be exemplified. However, the materials are not limited to the metals specifically listed as above. By the mode loss acting portion configured from any of the materials described, light can be absorbed to increase the mode loss. Alternatively, even if the materials do not directly absorb light, they can control the mode loss by disturbing the phase. In this case, the light emitting element can be configured such that the mode loss acting portion is made of a dielectric material and the optical thickness of the mode loss acting portion has a value displaced from an integer multiple of one fourth the wavelength of light generated by the light emitting element. In particular, the phase of light that goes around in the resonator to form a standing wave is disturbed at the mode loss acting portion thereby to destroy the standing wave, by which corresponding mode loss can be provided. Alternatively, the light emitting element can be configured such that the mode loss acting portion is made of a dielectric material and the optical thickness of the mode loss acting portion is an integer multiple of one fourth the wavelength of light generated by the light emitting element. In other words, the light emitting element can be configured such that the optical thickness of the mode loss acting portion is such a thickness that the phase of the light generated by the light emitting element is not disturbed and the standing wave is not destroyed. However, the optical thickness of the mode loss acting portion need not be strictly equal to an integer multiple of one fourth but must only satisfy $$(\lambda/4n_0) \times m - (\lambda/8n_0) \le t_0 \le (\lambda/4n_0) \times 2m + (\lambda/8n_0)$$

Alternatively, by configuring the light emitting element such that the mode loss acting portion is made of a dielectric material, a metal material or an alloy material, light passing through the mode loss acting portion can be disturbed in phase or absorbed by the mode loss acting portion. Further, by adopting the configurations described above, the control of the oscillation mode loss can be performed with a still higher degree of freedom and the degree of freedom in design of the light emitting element can be increased further.

Alternatively, the light emitting element according to the first mode of the present disclosure including the preferred modes described above can be configured such that a projecting portion is formed on the second face side of the second compound semiconductor layer, and the mode loss acting portion is formed on a region of the second face of the second compound semiconductor layer surrounding the projecting portion. A light emitting element of such a configuration as just described is called "light emitting element according to the 1-Dth mode of the present disclosure." The projecting portion occupies the current injection region and the current non-injection inner side region. In this case, the light emitting element can be configured such that, where the optical distance from the active layer in the current injection region to the second face of the second compound semiconductor layer is represented by $L_2$ and the optical distance from the active layer in the mode loss acting region to the top face of the mode loss acting portion is represented by $L_0$, $$L_0 < L_2$$

is satisfied. Further, in those case, generated light having a higher mode is confined to the current injection region and the current non-injection inner side region by the mode loss acting region, whereby the oscillation mode loss is reduced. In particular, the light field intensities of the basic mode and the higher order mode generated increase in a projection image of the current injection region and the current non-injection inner side region due to the presence of the mode loss acting region that acts upon increase or decrease of the oscillation mode loss. Furthermore, in those cases, the light emitting element can be configured such that the mode loss acting portion is made of a dielectric material, a metal material or an alloy material. Here, as the dielectric material, metal material and alloy material, the various materials described above are available.

Alternatively, the light emitting element according to the second mode of the present disclosure including the preferred modes described above can be configured such that a projecting portion is formed on the first face side of the first compound semiconductor layer, and the mode loss acting portion is formed in a region of the first face of the first compound semiconductor layer including the projecting portion or the compound semiconductor layer is configured from a region of the first compound semiconductor layer surrounding the projecting portion. A light emitting element of such a configuration as just described is called "light emitting element according to the 2-Dth mode of the present disclosure" for the convenience of description. The projecting portion coincides with a projection image of the current injection region and the current non-injection inner side region. Further, in this instance, the light emitting element can be configured such that, where the optical distance from the active layer in the current injection region to the first face of the first compound semiconductor layer is represented by $L_1'$ and the optical distance from the active layer in the mode loss acting region to the top face of the mode loss acting portion is represented by $L_0'$, $$L_0' < L_1'$$

is satisfied. Further, in those cases, the light emitting element can be configured such that generated light having a higher mode is confined to the current injection region and the current non-injection inner side region by the mode loss acting region, whereby the oscillation mode loss is reduced. Furthermore, in those cases, the light emitting element can be configured such that the mode loss acting portion is made of a dielectric material, a metal material or an alloy material. Here, as the dielectric material, metal material or alloy material, the various materials described above are available.

The light emitting elements according to the first and second modes of the present disclosure including the preferred modes and configurations described above can be configured such that the second electrode is made of a transparent conductive material.

From the light emitting elements according to the first and second modes of the present disclosure including the preferred modes and configurations described above (such light emitting elements are collectively referred to simply as "light emitting element and so forth of the present disclosure"), a surface emission laser element (vertical resonator laser, VCSEL) that emits light from the top face of the first compound semiconductor layer through the first light reflection layer can be configured, or also a surface emission laser element that emits laser light from the top face of the second compound semiconductor layer through the second light reflection layer can be configured.

Although, in the light emitting element and so forth of the present disclosure, the distance from the first light reflection layer to the second light reflection layer preferably is equal to or greater than 0.15 µm but is equal to or smaller than 50 µm, the distance is not limited to this.

The light emitting element and so forth of the present disclosure can be formed such that at least the second light reflection layer is fixed to a support substrate.

The light emitting element and so forth of the present disclosure can be formed such that the area center of gravity of the active layer does not exist on a normal to the first light reflection layer passing the area center of gravity of the first light reflection layer. When the first compound semiconductor layer is formed on the light emitting element fabrication substrate on which the first light reflection layer is formed by lateral growth using a method for epitaxial growth in a lateral direction such as an ELO (Epitaxial Lateral Overgrowth) method or the like, if the first compound semiconductor layer that epitaxially grows toward a central portion of the first light reflection layer from an edge portion of the first light reflection layer meets the first light reflection layer, then many crystal defects are generated at the meeting portion. If the meeting portion at which many crystal defects exist is positioned at a central portion of the current injection region, then there is the possibility that a bad influence may occur on a characteristic of the light emitting element. Alternatively, it is possible to form the light emitting element such that the area center of gravity of the active layer does not exist on a normal to the first light reflection layer passing the area center of gravity of the first light reflection layer. By forming the light emitting element such that the area center of gravity of the second light reflection layer does not exist on a normal to the first light reflection layer passing the area center of gravity of the first light reflection layer or such that the area center of gravity of the active layer does not exist on a normal to the first light reflection layer passing the area center of gravity of the first light reflection layer, occurrence of a bad influence on a characteristic of the light emitting element can be suppressed with certainty.

The light emitting element and so forth of the present disclosure can be configured such that the stacked structure is particularly made of an AlInGaN-based compound semiconductor. Here, as the AlInGaN-based compound semiconductor, more particularly GaN, AlGaN, InGaN and AlInGaN can be listed. Further, the compound semiconductors may contain boron (B) atoms or thallium (Tl) atoms, arsenic (As) atoms, phosphorus (P) atoms or antimony (Sb) atoms. The active layer preferably has a quantum well structure. In particular, the active layer may have a single quantum well structure (SQW structure). Although the active layer having a quantum well structure is structured such that at least one well layer and at least one barrier layer are stacked, as a combination (a compound semiconductor configuring the well layer, a compound semiconductor configuring the barrier layer), $(In_yGa_{(1-y)}N, GaN)$, $(In_yGa_{(1-y)}N, In_zGa_{(1-z)}N)$ [where y>z], $(In_yGa_{(1-y)}N, AlGaN)$ can be exemplified. It is possible to configure the first compound semiconductor layer from a compound semiconductor of a first conductivity type (for example, n type) and configure the second compound semiconductor layer from a compound semiconductor of a second conductivity type (for example, p type) different from the first conductivity type. The first compound semiconductor layer and the second compound semiconductor layer are also called first cladding layer and second cladding layer, respectively. Each of the first compound semiconductor layer and the second compound semiconductor layer may be a layer of a single layer structure or a layer of a multilayer structure or may otherwise be a layer of a superlattice structure. Furthermore, each of the first compound semiconductor layer and the second compound semiconductor layer may be formed as a structure including a composition gradient layer or a concentration gradient layer.

Although the stacked structure is formed on the first face of a light emitting element fabrication substrate, as the light emitting element fabrication substrate, a GaN substrate, a sapphire substrate, a GaAs substrate, a SiC substrate, an alumina substrate, a ZnS substrate, a ZnO substrate, an AlN substrate, a LiMgO substrate, a $LiGaO_2$ substrate, a $MgAl_2O_4$ substrate, an InP substrate, a Si substrate and any of the substrates having a ground layer or a buffer layer formed on a surface (main surface) thereof can be listed. However, preferably a GaN substrate is used since it has a low defect density. Although it is known that a characteristic of the GaN substrate differs like polar/nonpolar/semi-polar depending upon the growth surface, it is possible to use any main surface of the GaN substrate for formation of a compound semiconductor layer. Further, regarding the main surface of the substrates, depending upon the crystal structure (for example, cubic type, hexagonal type or the like), also crystal orientation planes called by such names as A plane, B plane, C plane, R plane, M plane, N plane and S plane or planes obtained by offsetting them in a specific direction can be used. As a formation method of various compound semiconductor layers configuring light emitting elements, for example, an organometallic chemical vapor deposition method (MOCVD method, Metal Organic-Chemical Vapor Deposition method, MOVPE method, Metal Organic-Vapor Phase Epitaxy method), a molecular beam epitaxy method (MBE method), a hydride vapor phase growth method (HVPE method) in which halogen contributes to transportation or reaction, an atomic layer deposition method (ALD method), a migration-enhanced epitaxy method (MEE method), a plasma-assisted physical vapor phase growth method (PPD) method and so forth can be listed. However, the formation method is not limited to them.

Here, as an organic gallium source gas in the MOCVD method, trimethyl gallium (TMG) gas and triethyl gallium (TEG) gas can be listed, and as the nitrogen source gas, ammonia gas and hydrazine gas can be listed. In formation of a GaN-based compound semiconductor layer having the n-type conductivity, for example, silicon (Si) may be added as an n-type impurity (n-type dopant), and in formation of a GaN-based compound semiconductor layer having the p-type conductivity, for example, magnesium (Mg) may be added as a p-type impurity (p-type dopant). Where aluminum (Al) or indium (In) is contained as a constituent atom of a GaN-based compound semiconductor layer, trimethyl aluminum (TMA) gas may be used as an Al source, and trimethyl indium (TMI) gas may be used as an In source. Furthermore, monosilane gas ($SiH_4$ gas) may be used as a Si source, and bis-cyclopentadienyl magnesium gas or methylcyclopentadienyl magnesium, bis-cyclopentadienyl magnesium ($Cp_2Mg$) may be used as a Mg source. It is to be noted that, as the n-type impurity (n-type dopant), Ge, Se, Sn, C, Te, S, O, Pd and Po can be listed in addition to Si, and as the p-type impurity (p-type dopant), Zn, Cd, Be, Ca, Ba, C, Hg and Sr can be listed in addition to Mg.

The support substrate may be configured, for example, from various substrates exemplified as a light emitting element fabrication substrate, or can be configured also from an insulating substrate made of AiN or the like, a semiconductor substrate made of Si, SiC, Ge or the like, a metal substrate or an alloy substrate. However, preferably a substrate having conductivity is used, or a metal substrate or an alloy substrate is preferably used from the point of view of a mechanical characteristic, elastic deformation, plastic deformability, heat dissipation and so forth. As the thickness of the support substrate, for example, 0.05 to 0.5 mm can be exemplified. As a fixation method of the second light reflection layer to the support substrate, a known method such as a solder bonding method, a room temperature bonding method, a bonding method using an adhesive tape, a bonding agent using wax junction or the like can be used. However, from a point of view of securing of conductivity, it is desirable to adopt a solder bonding method or a room temperature bonding method. For example, where a silicon semiconductor substrate that is a conductive substrate is used as the support substrate, in order to suppress warping by a difference in coefficient of thermal expansion, it is desirable to adopt a method by which the support substrate can be bonded at a low temperature equal to or lower than 400° C. Where a GaN substrate is used as the support substrate, the bonding temperature may be equal to or higher than 400° C.

In fabrication of the light emitting element and so forth of the present disclosure, the light emitting element fabrication substrate may be left, or where the first light reflection layer is formed after the active layer, second compound semiconductor layer, second electrode and second light reflection layer are successively formed on the first compound semiconductor layer, the light emitting element fabrication substrate may be removed using the first light reflection layer as a stopper layer. In particular, after the active layer, second compound semiconductor layer, second electrode and second light reflection layer are successively formed on the first compound semiconductor layer and then the second light reflection layer is fixed to the support substrate, if the first light reflection layer is formed, the light emitting element fabrication substrate may be removed using the first light emission layer as a stopper layer to expose the first compound semiconductor layer (first face of the first compound semiconductor layer) and the first light reflection layer. Further, the first electrode may be formed on the first compound semiconductor layer (first face of the first compound semiconductor layer).

The removal of the light emitting element fabrication substrate can be performed in a form in which it is performed by a chemical/mechanical polishing method (CMP method). It is to be noted that removal of part of the light emitting element fabrication substrate may be performed or the thickness of the light emitting element fabrication substrate may be reduced first by a wet etching method using alkaline aqueous solution such as aqueous sodium hydroxide solution or aqueous potassium hydroxide solution, ammonia solution+hydrogen peroxide solution, sulfuric acid solution+hydrogen peroxide solution, hydrochloric acid solution+hydrogen peroxide solution, phosphoric acid solution+hydrogen peroxide solution or the like, a dry etching method, a liftoff method using a laser, a mechanical polishing method or the like or by a combination of them, whereafter a chemical/mechanical polishing method is performed to expose the first compound semiconductor layer (first face of the first compound semiconductor layer) and, where the first light reflection layer is formed, the first light reflection layer.

Although it is known that the characteristic of a GaN substrate differs in characteristic like polar/nonpolar/semipolar depending upon the growth surface, it is possible to use any main surface of the GaN substrate for formation of a compound semiconductor layer. Further, regarding the main surface of the GaN substrates, depending upon the crystal structure (for example, cubic type, hexagonal type or the like), also a plane provided by offsetting a plane orientation of a crystal plane called as such a name as A plane, B plane, C plane, R plane, M plane, N plane, S plane or the like (including a case in which the offset angle is 0 degree) is used.

Where the light emitting element fabrication substrate is left, the first electrode may be formed on the second face opposing to the first face of the light emitting element fabrication substrate. On the other hand, where the light emitting element fabrication substrate is not left, the first electrode may be formed on the first face of the first compound semiconductor layer that configures the stacked structure. It is to be noted that, in this case, since the first light reflection layer is formed on the first face of the first compound semiconductor layer, the first electrode may be formed, for example, so as to surround the first light reflection layer. The first electrode preferably has a single layer configuration or a multilayer configuration including at least one kind of metal (including an alloy) selected, for example, from a group including gold (Au), silver (Ag), palladium (Pd), platinum (Pt), nickel (Ni), Ti (titanium), vanadium (V), tungsten (W), chromium (Cr), Al (aluminum), Cu (copper), Zn (zinc), tin (Sn) and indium (In), and particularly, for example, Ti/Au, Ti/Al, Ti/Al/Au, Ti/Pt/Au, Ni/Au, Ni/Au/Pt, Ni/Pt, Pd/Pt and Ag/Pd can be exemplified. It is to be noted that a layer preceding to "/" in the multilayer configuration is positioned at the side nearer to the active layer. This similarly applies also to the description given below. The first electrode can be formed as a film by a physical vapor deposition (PVD) method such as, for example, a vacuum deposition method or a sputtering method.

Where the first electrode is formed so as to surround the first light reflection layer, the light emitting element and so forth of the present disclosure can be configured such that the first light reflection layer and the first electrode contact with each other. Alternatively, the light emitting element and so forth of the present disclosure can be configured such that the first light reflection layer and the first electrode are spaced from each other, namely, have an offset therebetween and the spaced distance is within 1 mm. If the current injection region positioned in the first light reflection layer and the first electrode are spaced from each other in a plane, then current will flow over a long distance in the first compound semiconductor layer. Therefore, in order to suppress the electric resistance, which appears in the current path, low, preferably the spaced distance is within 1 mm. In some cases, also a state in which the first electrode is formed even across an edge portion of the first light reflection layer and another state in which the first light reflection layer is formed even across an edge portion of the first electrode can be listed. Here, where the state in which the first light reflection layer is formed even across an edge portion of the first electrode is to be applied, it is necessary for the first electrode to have an opening of some size such that the first electrode does not absorb basic mode light of laser oscillation as far as possible. Since the magnitude of the opening varies depending upon the wavelength of the basic mode or the light confinement structure in a lateral direction (in-plane direction of the first compound semiconductor layer), although this is not restricted, it preferably is roughly on the order of several times the oscillation frequency $\lambda$.

As the transparent conductive material configuring the second electrode, indium tin composite oxides (including ITO, Indium Tin Oxide, Sn-doped $In_2O_3$, crystalline ITO and amorphous ITO), ITiO (Ti-doped $In_2O_3$), indium zinc composite oxides (IZO, Indium Zinc Oxide), IFO (F-doped $In_2O_3$), tin oxides ($SnO_2$), ATO (Sb-doped $SnO_2$), FTO (F-doped $SnO_2$), zinc oxides (including ZnO, Al-doped ZnO, B-doped ZnO), indium-doped gallium zinc composite oxides (IGZO, In—$GaZnO_4$), aluminum oxide-doped zinc oxides (AZO), AlMgZnO (aluminum oxide- and magnesium oxide-doped zinc oxide), indium gallium composite oxides (IGO), InSnZnO, NiO, or gallium-doped zinc oxides (GZO) can be exemplified. Alternatively, for the second electrode, a transparent conductive film including a mother layer made of gallium oxide, titanium oxide, niobium oxide, nickel oxide or the like can be listed. The second electrode may be configured from at least one of the materials listed above. The second electrode can be formed as a film by a PVD method such as, for example, a vacuum deposition method or a sputtering method. By configuring the second electrode from a transparent conductive material, current can be spread in the transverse direction (in-plane direction of the second compound semiconductor layer), and current can be supplied to the current injection region efficiently.

In order to establish electric connection to an external electrode or circuit, a pad electrode may be provided on the first electrode or the second electrode. The pad electrode preferably has a single layer configuration or a multilayer configuration including at least one metal selected from a group including Ti (titanium), aluminum (Al), Pt (platinum), Au (gold), Ni (nickel) and Pd (palladium). Alternatively, the pad electrode may have a multilayer configuration of Ti/Pt/Au, a multilayer configuration of Ti/Au, a multilayer configuration of Ti/Pd/Au, a multilayer configuration of Ti/Pd/Au, a multilayer configuration of Ti/Ni/Au, or a multilayer configuration of Ti/Ni/Au/Cr/Au. Where the first electrode is configured from an Ag layer or an Ag/Pd layer, preferably a cover metal layer configured, for example, from Ni/TiW/Pd/TiW/Ni is formed on the surface of the first electrode and a pad electrode having, for example, a multilayer configuration of Ti/Ni/Au or a multilayer configuration of Ti/Ni/Au/Cr/Au is formed on the cover metal layer.

A light reflection layer (Distributed Bragg Reflector layer, DBR layer) configuring the first light reflection layer and the second light reflection layer is configured, for example, from a semiconductor multilayer film or a dielectric multilayer film. As the dielectric material, oxides of, for example, Si, Mg, Al, Hf, Nb, Zr, Sc, Ta, Ga, Zn, Y, B, Ti and so forth, nitrides (for example, $SiN_X$, $AlN_X$, $AlGaN_X$, $GaN_X$, $BN_X$ and so forth), fluorides or the like can be listed. In particular, $SiO_X$, $TiO_X$, $NbO_X$, $ZrO_X$, $TaO_X$, $ZnO_X$, $AlO_X$, $HfO_X$, $SiN_X$, $AlN_X$ and so forth can be exemplified. Further, by alternately stacking two or more different kinds of dielectric films made of dielectric materials having refractive indexes different from each other from among the dielectric materials listed above, a light reflection layer can be obtained. For example, a multilayer film of $SiO_X/SiN_Y$, $SiO_X/NbO_Y$, $SiO_X/ZrO_Y$ or $SiO_X/AlN_Y$ is preferable. In order to obtain a desired light reflectance, the material, film thickness, stacked layer number and so forth configuring each dielectric film may be suitably selected. The thickness of each dielectric film can be suitably adjusted by a material to be used or the like and is determined depending upon the oscillation wavelength (emission light wavelength) λ and the refractive index n at the oscillation wavelength λ of the material used. In particular, the thickness of each dielectric layer is preferably set to an odd-numbered multiple of $\lambda/(4n)$. For example, where a light reflection layer in a light emitting element whose oscillation wavelength λ is 410 nm is configured from $SiO_X/NbO_Y$, approximately 40 to 70 nm can be exemplified. As the stacked layer number, two or more, preferably, approximately 5 to 20, can be exemplified. As the thickness of the overall light reflection layer, for example, approximately 0.6 to 1.7 μm can be exemplified.

The light reflection layer can be formed by a known method, and particularly a PVD method such as, for example, a vacuum deposition method, a sputtering method, a reactive sputtering method, an electron cyclotron resonance (ECR) plasma sputtering method, a magnetron sputtering method, an ion beam-assisted deposition method or an ion plating method; various CVD methods; a coating method such as a spraying method, a spin coating method or a dipping method; a method of a combination of two or more of the methods; a method of a combination of any of the methods and at least one of a whole or partial pretreatment, irradiation of inert gas (Ar, He, Xe or the like) or plasma, irradiation of oxygen gas, ozone gas or plasma, an oxidation process (heat treatment) and a light exposure process, and so forth can be listed.

Alternatively, the first light reflection layer preferably includes a dielectric film containing at least N (nitrogen) atoms, and more preferably, the dielectric film containing N atoms is the uppermost layer of the dielectric multilayer film. Alternatively, the first light reflection layer is preferably coated with a dielectric material layer containing at least N (nitrogen) atoms. Alternatively, preferably the surface of the first light reflection layer is formed from a layer containing at least N (nitrogen) atoms (such a layer is hereinafter referred to as "surface layer" for the convenience of description) by performing a nitriding treatment for the surface of the first light reflection layer. The thickness of the dielectric film, dielectric material layer or surface layer containing at least N atoms preferably is equal to an odd-numbered times of $\lambda/(4n)$. As a material that configures the dielectric film or dielectric material layer containing at least N atoms, particularly $SiN_X$ and $SiO_YN_Z$ can be listed. By forming a dielectric film, a dielectric material layer or a surface layer containing at least N atoms in this manner, when a compound semiconductor layer that covers the first light reflection layer is formed, it is possible to improve the displacement between the crystal axis of the compound semiconductor layer that covers the first light reflection layer and the crystal axis of the light emitting element fabrication substrate, and the quality of the stacked structure that becomes a resonator can be enhanced.

The light reflection layer is not restricted especially in terms of the size and the shape as long as it covers the current injection region. As the shape of the boundary between the current injection region and the current non-injection inner side region and the shape of the boundary between the current non-injection inner side region and the current non-injection outer side region, for example, a circular shape, an elliptical shape, a rectangular shape and a polygonal shape (triangular shape, rectangular shape, hexagonal shape or the like) can be listed. Preferably, the shape of the boundary between the current injection region and the current non-injection inner side region and the shape of the boundary between the current non-injection inner side region and the current non-injection outer side region are similar in shape. Where the shape of the boundary between the current injection region and the current non-injection inner side region is a circular shape, preferably the diameter of the circular shape is approximately 5 to 100 μm.

The side face or the exposed face of the stacked structure may be coated with an insulating film. Formation of the insulating film can be performed by a known method. The refractive index of the material that configures the insulating film preferably is lower than the refractive index of the material that configures the stacked structure. As the material for configuring the insulating film, $SiO_X$-based materials including $SiO_2$, $SiN_X$-based materials, $SiO_YN_Z$-based materials, $TaO_X$, $ZrO_X$, $AlN_X$, $AlO_X$ and $GaO_X$ can be listed, or also organic materials such as polyimide resin can be listed. As a formation method of the insulating film, a PVD method such as, for example, a vacuum deposition method or a sputtering method or a CVD method can be listed, and also it is possible to form the insulating film by a coating method.

Working Example 1

A working example 1 relates to a light emitting element according to the first mode of the present disclosure, particularly to a light emitting element according to the 1-Ath mode of the present disclosure. More particularly, the light emitting element of the working example 1 or any of a working example 2 to a working example 4 includes a surface emission laser element (vertical resonator layer, VCSEL) that emits laser light from a top face of a second compound semiconductor layer 22 through a second light reflection layer 42.

Figure 1:
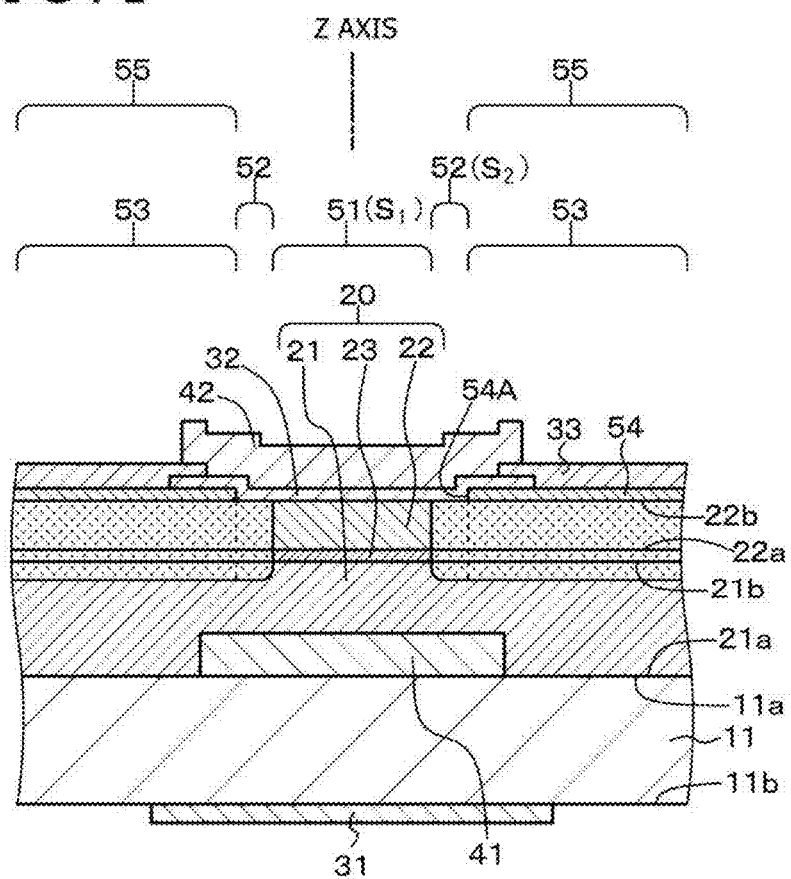
FIG. 1 is a schematic partial sectional view of a light emitting element of a working example 1.

The light emitting element of the working example 1 whose schematic partial end view is depicted in FIG. 1 or the light emitting element of any of the working example 2 to the working example 5 includes:

(A) a stacked structure 20 in which
a first compound semiconductor layer 21 made of a GaN-based compound semiconductor and having a first face 21a and a second face 21b opposing to the first face 21a,
an active layer (light emitting layer) 23 made of a GaN-based compound semiconductor and contacting with the second face 21b of the first compound semiconductor layer 21, and
the second compound semiconductor layer 22 made of a GaN-based compound semiconductor, having a first face 22a and a second face 22b opposing to the first face 22a and contacting at the first face 22a thereof with the active layer 23
are stacked;

(B) a mode loss acting portion (mode loss acting layer) 54 provided on the second face 22b of the second compound semiconductor layer 22 and configuring a mode loss acting region 55 that acts upon increase or decrease of oscillation mode loss;

(C) a second electrode 32 formed over a region from the second face 22b of the second compound semiconductor layer 22 to the mode loss acting portion 54;

(D) a second light reflection layer 42 formed on the second electrode 32;

(E) a first light reflection layer 41 formed on the first face 21a of the first compound semiconductor layer 21; and (F) a first electrode 31 electrically connected to the first compound semiconductor layer 21. It is to be noted that, in the light emitting element of the working example 1 and the light emitting elements of the working example 2 to the working example 4 hereinafter described, the stacked structure 20 is formed on a first face 11a of a light emitting element fabrication substrate 11 having conductivity, and the first electrode 31 is formed on a second face 11*b* opposing to the first face 11*a* of the light emitting element fabrication substrate 11.

Further, the stacked structure 20 has formed thereon a current injection region 51, a current non-injection inner side region 52 that surrounds the current injection region 51, and a current non-injection outer side region 53 that surrounds the current non-injection inner side region 52, and a projection image of the mode loss acting region 55 and a projection image of the current non-injection outer side region 53 overlap with each other. In other words, the current non-injection outer side region 53 is positioned below the mode loss acting region 55. It is to be noted that, in a region spaced sufficiently from the current injection region 51 to which current is injected, a projection image of the mode loss acting region 55 and a projection image of the current non-injection outer side region 53 may not overlap with each other. Here, although the current non-injection regions 52 and 53 to which current is not injected are formed on the stacked structure 20, in the example depicted, the current non-injection regions 52 and 53 are formed over a range from the second compound semiconductor layer 22 to part of the first compound semiconductor layer 21 in the thicknesswise direction. However, the current non-injection regions 52 and 53 may be formed in a region at the second electrode side of the second compound semiconductor layer 22 in the thicknesswise direction or may be formed over the overall second compound semiconductor layer 22 or may otherwise be formed over the second compound semiconductor layer 22 and the active layer 23.

The mode loss acting portion (mode loss acting layer) 54 is formed from a dielectric material such as $SiO_2$, and is formed, in the light emitting element of the working example 1 or any of the working examples 2 to 5, between the second electrode 32 and the second compound semiconductor layer 22. The optical thickness of the mode loss acting portion 54 can be set to a value displaced from integer multiples of one fourth the wavelength of light generated by the light emitting element. Alternatively, also it is possible to set the optical thickness of the mode loss acting portion 54 to an integer multiple of one fourth the wavelength of light generated by the light emitting element. In other words, the optical thickness of the mode loss acting portion 54 can be set to such a thickness that the phase of light generated by the light emitting element is not disturbed and the standing wave is not destroyed. However, the optical thickness of the mode loss acting portion 54 need not strictly be an integer multiple of one forth the wavelength but must only satisfy $$(\lambda/4n_0) \times m - (\lambda/8n_0) \le t_0 \le (\lambda/4n_0) \times 2m + (\lambda/8n_0)$$

In particular, where the value of one fourth the wavelength of light generated by the light emitting element is "100," preferably the optical thickness of the mode loss acting portion 54 is approximately 25 to 250. Further, by adopting the configurations described above, the phase difference between laser light that passes the mode loss acting portion 54 and laser light that passes the current injection region 51 can be changed (the phase difference can be controlled), and the control of the oscillation mode loss can be performed with a still higher degree of freedom and the degree of freedom in design of the light emitting element can be increased further.

In the working example 1, the shape of the boundary between the current injection region 51 and the current non-injection inner side region 52 was made a circular shape (diameter: 8 μm) and the shape of the boundary between the current non-injection inner side region 52 and the current non-injection outer side region 53 was made a circular shape (diameter: 12 μm). In particular, where the area of a projection image of the current injection region 51 is represented by $S_1$ and the area of a projection image of the current non-injection inner side region 52 is represented by $S_2$, $$0.01 \le S_1/(S_1+S_2) \le 0.7$$

is satisfied. In particular, $$S_1/(S_1+S_2) = 8^2/12^2 = 0.44$$

is satisfied.

In the light emitting element of the working example 1 or any of the working examples 2 to 3 and 5 hereinafter described, where the optical distance from the active layer 23 in the current injection region 51 to the second face of the second compound semiconductor layer 22 is represented by $L_2$ and the optical distance from the active layer 23 in the mode loss acting region 55 to the top face of the mode loss acting portion 54 (face opposing to the second electrode 32) is represented by $L_0$, $$L_0 > L_2$$

is satisfied. In particular, the distance was set so as to satisfy $$L_0/L_2 = 1.5.$$

Then, the generated laser light having a higher mode is dissipated toward the outer side of the resonator structure configured from the first light reflection layer 41 and the second light reflection layer 42 by the mode loss acting region 55, whereby the oscillation mode loss increases. In particular, although the light field intensities of the generated basic mode and higher mode decrease, due to the presence of the mode loss acting region 55 that acts upon increase or decrease of the oscillation mode loss, as the distance from the Z axis increases in the projection image of the mode loss acting region 55 (refer to a conceptual view of (B) of FIG. 11), the decrease of the light field intensity of the higher mode is greater than the decrease of the light field intensity of the basic mode. Consequently, the basic mode can be stabilized further and reduction of the threshold value current can be achieved, and the relative light field intensity of the basic mode can be increased. Besides, since a hem portion of the light field intensity of the higher order is positioned still farther than that of a conventional light emitting element (refer to (A) of FIG. 11) from the current injection region, reduction of the influence of the inverse lens effect can be achieved. It is to be noted that, where the mode loss acting portion 54 made of $SiO_2$ is not provided, oscillation mode mixture occurs.

The first compound semiconductor layer 21 is formed from an n-GaN layer, and the active layer 23 is formed from a five-fold multiple quantum well structure in which an $In_{0.04}Ga_{0.96}N$ layer (barrier layer) and an $In_{0.16}Ga_{0.84}N$ layer (well layer) are stacked while the second compound semiconductor layer 22 is formed from a p-GaN layer. Further, the first electrode 31 is configured from Ti/Pt/Au, and the second electrode 32 is configured from a transparent conductive material, particularly from ITO. A circular opening 54A is formed at the mode loss acting portion 54, and the second compound semiconductor layer 22 is exposed to the bottom of the circular opening 54A. At an edge portion of the first electrode 31, a pad electrode (not depicted) is formed or connected which is configured, for example, from Ti/Pt/Au or V/Pt/Au for establishing electric connection to an external electrode or circuit. At an edge portion of the second electrode 32, a pad electrode 33 is formed or connected which is configured, for example, from Ti/Pd/Au or Ti/Ni/Au for establishing electric connection to an external electrode or circuit. The first light reflection layer 41 and the second light reflection layer 42 are configured from a stacked structure of a SiN layer and a SiO$_2$ layer (total layer number of dielectric films: 20 layers). Although the first light reflection layer 41 and the second light reflection layer 42 have a multilayer structure in this manner, for the simplification of the drawings, they are represented by one layer. The distance from the first light reflection layer 41 to the second light reflection layer 42 is equal to or greater than 0.15 μm but equal to or smaller than 50 μm, and particularly is, for example, 4.5 μm.

In the light emitting element of the working example 1, the current non-injection inner side region 52 and the current non-injection outer side region 53 are formed by ion injection into the stacked structure 20. Although, for example, boron was selected as the ion species, the ion species is not limited to the boron ion.

Figure 2A:
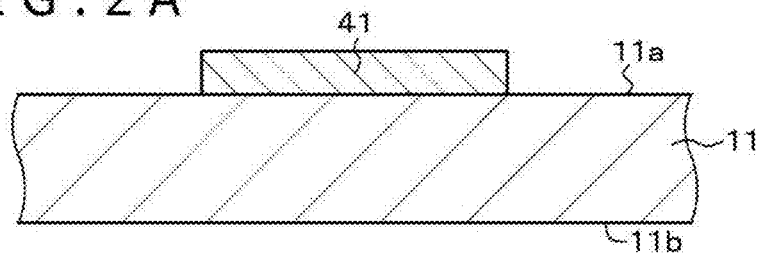
FIGS. 2A, 2B and 2C are schematic partial sectional views of a stacked structure or the like illustrating a fabrication method of the light emitting element of the working example 1.

In the following, a fabrication method of the light emitting element of the working example 1 is described with reference to FIGS. 2A, 2B and 2C that are schematic partial end views of a stacked structure and so forth.

[Step 100]

First, a first light reflection layer 41 formed from a multilayer film and having a projecting shape is formed on a light emitting element fabrication substrate 11. In particular, the first light reflection layer 41 formed from a multilayer film and patterned is formed by a known method on the first face 11a of a light emitting element fabrication substrate 11 formed from a GaN substrate. The structure depicted in FIG. 2A can be obtained in this manner. The shape of the first light reflection layer 41 is a disk shape. However, the shape of the first light reflection layer 41 is not limited to this.

[Step 110]

Then, on the light emitting element fabrication substrate 11 including the first light reflection layer 41, a first compound semiconductor layer 21 made of a GaN-based compound semiconductor and having a first face 21a and a second face 21b that opposes to the first face 21a, an active layer (light emitting layer) 23 made of a GaN-based compound semiconductor and contacting with the second face 21b of the first compound semiconductor layer 21, and a second compound semiconductor layer 22 made of a GaN-based compound semiconductor, having a first face 22a and a second face 22b that opposes to the first face 22a and contacting at the first face 22a thereof with the active layer 23 are stacked to form a stacked structure 20. In particular, a stacked structure 20 can be obtained by forming a first compound semiconductor layer 21 made of n-GaN by lateral growth using a method for epitaxial growth in a lateral direction such as an ELO method and further forming an active layer 23 and a second compound semiconductor layer 22 by an epitaxial growth method on the first compound semiconductor layer 21.

[Step 120]

Thereafter, a current non-injection inner side region 52 and a current non-injection outer side region 53 are formed on the stacked structure 20 by an ion injection method using boron ions.

[Step 130]

Figure 2B:
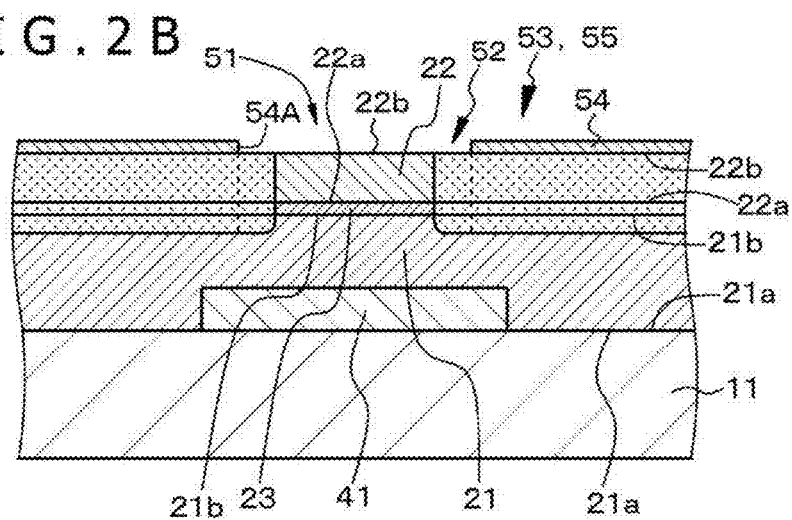
Figure 2C:
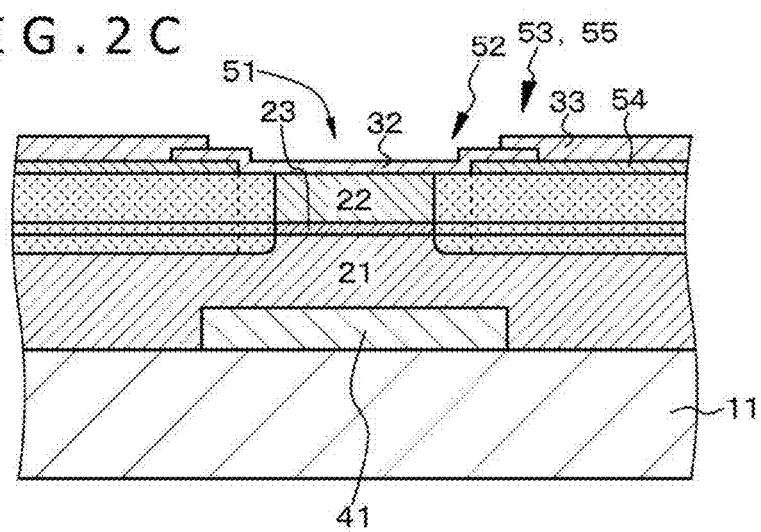

Then, on the second face 22b of the second compound semiconductor layer 22, a mode loss acting portion (mode loss acting layer) 54 having an opening 54A and made of SiO$_2$ is formed by a known method (refer to FIG. 2B).

[Step 140]

Thereafter, a second electrode 32 is formed, for example, by a liftoff method over a region from the second face 22b of the second compound semiconductor layer 22 exposed to the bottom face of the opening 54A to the mode loss acting portion (mode loss acting layer) 54, and further, a pad electrode 33 is formed by a known method. A structure depicted in FIG. 2C can be obtained in this manner. Then, a second light reflection layer 42 is formed by a known method over a region from the second electrode 32 to the pad electrode 33. The structure depicted in FIG. 1 can be obtained in this manner. Thereafter, a first electrode 31 and so forth are formed on the second face 11b of the light emitting element fabrication substrate 11 by a known method, and further, so-called element separation is performed to separate a light emitting element, and a side face and an exposed face of the stacked structure is coated with an insulating film made of, for example, SiO$_2$. Then, packaging or sealing is performed to complete the light emitting element of the working example 1.

In the light emitting element of the working example 1, the stacked structure has formed thereon a current injection region, a current non-injection inner side region that surrounds the current injection region and a current non-injection outer side region that surrounds the current non-injection inner side region, and a projection image of a mode loss acting region and a projection image of the current non-injection outer side region overlap with each other. Therefore, increase or decrease (in particular, in the working example 1, increase) of the oscillation mode loss can be controlled to a desired state as indicated in a conceptual view of (B) of FIG. 11. Then, as a result, such a problem in a conventional light emitting element as, for example, increase of the threshold value current or degradation of a slope effect can be solved. For example, reduction of the threshold value current can be achieved by reducing the oscillation mode loss of the basic mode. Besides, since the region to which oscillation mode loss is provided and the region that contributes to light emission with current injected thereto can be controlled independently of each other, the degree of freedom in control and the degree of freedom in design of a light emitting element can be increased. In particular, by arranging the current injection region, current non-injection region and mode loss acting region in the predetermined arrangement relationship described above, the relationship in magnitude of the oscillation mode losses provided by the mode loss acting region to the basic mode and the higher mode can be controlled, and by setting the oscillation mode loss provided to the higher mode comparatively high with respect to the oscillation mode loss provided to the basic mode, the basic mode can be stabilized further.

Working Example 2

Figure 3:
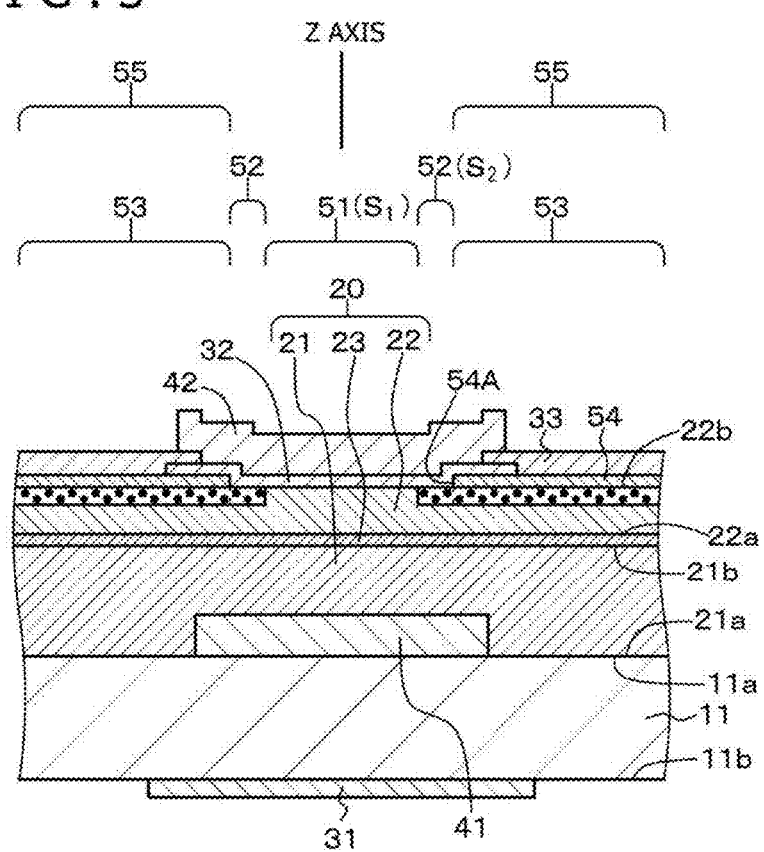
FIG. 3 is a schematic partial sectional view of a light emitting element of a working example 2.

The working example 2 is a modification to the working example 1 and relates to a light emitting element according to the 1-Bth mode of the present disclosure. As depicted in a schematic partial sectional view of FIG. 3, in the light emitting element of the working example 2, the current non-injection inner side region 52 and the current non-injection outer side region 53 are formed by plasma irradiation upon the second face of the second compound semiconductor layer 22, an ashing process for the second face of the second compound semiconductor layer 22 or a reactive ion etching (RIE) process for the second face of the second compound semiconductor layer 22. Then, since the current non-injection inner side region 52 and the current non-injection outer side region 53 are exposed to plasma particles (in particular, of argon, oxygen, nitrogen or the like) in this manner, degradation occurs with the conductivity of the second compound semiconductor layer 22, and the current non-injection inner side region 52 and the current non-injection outer side region 53 are placed into a high resistance state. In other words, the current non-injection inner side region 52 and the current non-injection outer side region 53 are formed by exposure of the second face 22b of the second compound semiconductor layer 22 to plasma particles.

Also in the working example 2, the shape of the boundary between the current injection region 51 and the current non-injection inner side region 52 was made a circular shape (diameter: 10 μm) and the shape of the boundary between the current non-injection inner side region 52 and the current non-injection outer side region 53 was made a circular shape (diameter: 15 μm). In particular, where the area of a projection image of the current injection region 51 is represented by $S_1$ and the area of a projection image of the current non-injection inner side region 52 is represented by $S_2$, $$0.01 \leq S_1/(S_1+S_2) \leq 0.7$$

is satisfied. In particular, $$S_1/(S_1+S_2) = 10^2/15^2 = 0.44$$

is satisfied.

In the working example 2, the current non-injection inner side region 52 and the current non-injection outer side region 53 may be formed in the stacked structure 20 by plasma irradiation upon the second face of the second compound semiconductor layer 22, an ashing process for the second face of the second compound semiconductor layer 22 or a reactive ion etching process for the second face of the second compound semiconductor layer 22 in place of the [step 120] in the working example 1.

Except the foregoing, the components and structure of the light emitting element of the working example 2 can be made similar to the components and structure of the light emitting element of the working example 1, and therefore, detailed description of them is omitted herein.

Also in the light emitting element of the working example 2 or of the working example 3 hereinafter described, by setting the current injection region, current non-injection region and mode loss acting region to the predetermined arrangement relationship as described above, the relationship in magnitude of the oscillation mode losses provided by the mode loss acting region to the basic mode and the higher mode can be controlled, and by setting the oscillation mode loss provided to the higher mode comparatively high with respect to the oscillation mode loss provided to the basic mode, the basic mode can be stabilized further.

Working Example 3

Figure 4:
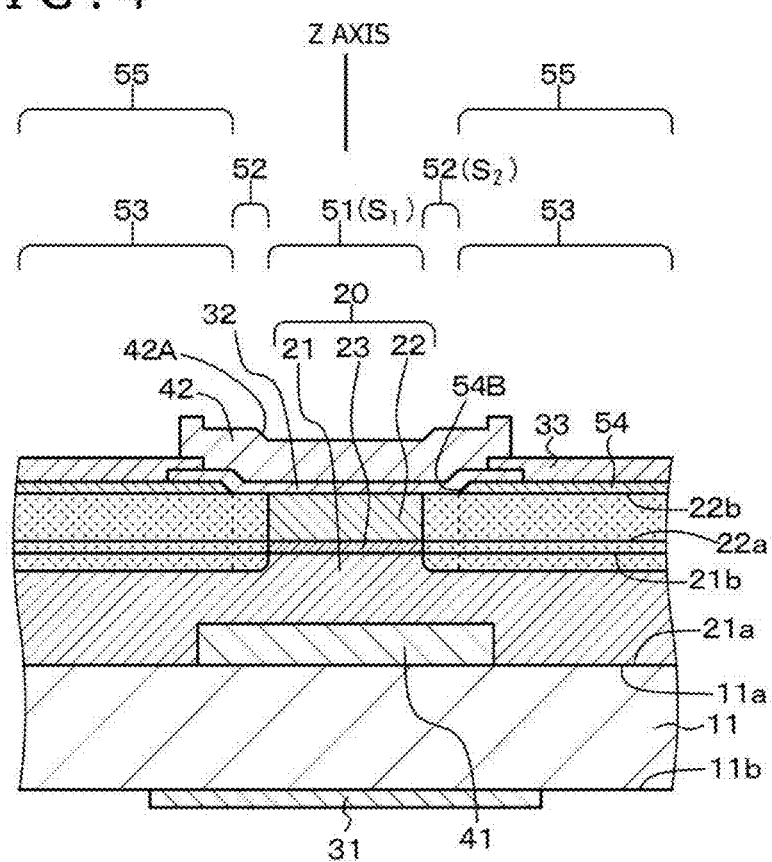
FIG. 4 is a schematic partial sectional view of a light emitting element of a working example 3.

The working example 3 is a modification to the working examples 1 and 2 and relates to a light emitting element according to the 1-Cth mode of the present disclosure. As depicted in a schematic partial sectional view of FIG. 4, in the light emitting element of the working example 3, the second light reflection layer 42 has a region that reflects or scatters light from the first light reflection layer 41 toward the outer side of the resonator structure configured from the first light reflection layer 41 and the second light reflection layer 42 (namely, toward the mode loss acting region 55). In particular, a portion of the second light reflection layer 42 that is positioned above a side wall of the mode loss acting portion (mode loss acting layer) 54 (above a side wall of an opening 54B) has a forwardly tapering inclined portion 42A or has a region curved projectingly toward the first light reflection layer 41.

In the working example 3, the shape of the boundary between the current injection region 51 and the current non-injection inner side region 52 was made a circular shape (diameter: 8 μm) and the shape of the boundary between the current non-injection inner side region 52 and the current non-injection outer side region 53 was made a circular shape (diameter: 10 to 20 μm).

In the working example 3, when the mode loss acting portion (mode loss acting layer) 54 having the opening 54B and made of $SiO_2$ is to be formed at a step similar to the [step 130] in the working example 1, an opening 54B having a forwardly tapering side wall may be formed. In particular, a resist layer is formed on a mode loss acting layer formed on the second face 22b of the second compound semiconductor layer 22, and at a portion of the resist layer at which the opening 54B is to be formed, an opening is provided by a photolithography technology. By a known method, the side wall of the opening is formed in a forwardly tapering manner. Then, by performing etching back, the opening 54B having a forwardly tapering side wall can be formed at the mode loss acting portion (mode loss acting layer) 54. Further, by forming the second electrode 32 and the second light reflection layer 42 on such a mode loss acting portion (mode loss acting layer) 54 as just described, a forwardly tapering inclined portion 42A can be provided on the second light reflection layer 42.

Except the foregoing, the components and structure of the light emitting element of the working example 3 can be made similar to the components and structure of the light emitting element of the working examples 1 and 2, and therefore, detailed description of them is omitted herein.

Working Example 4

Figure 5:
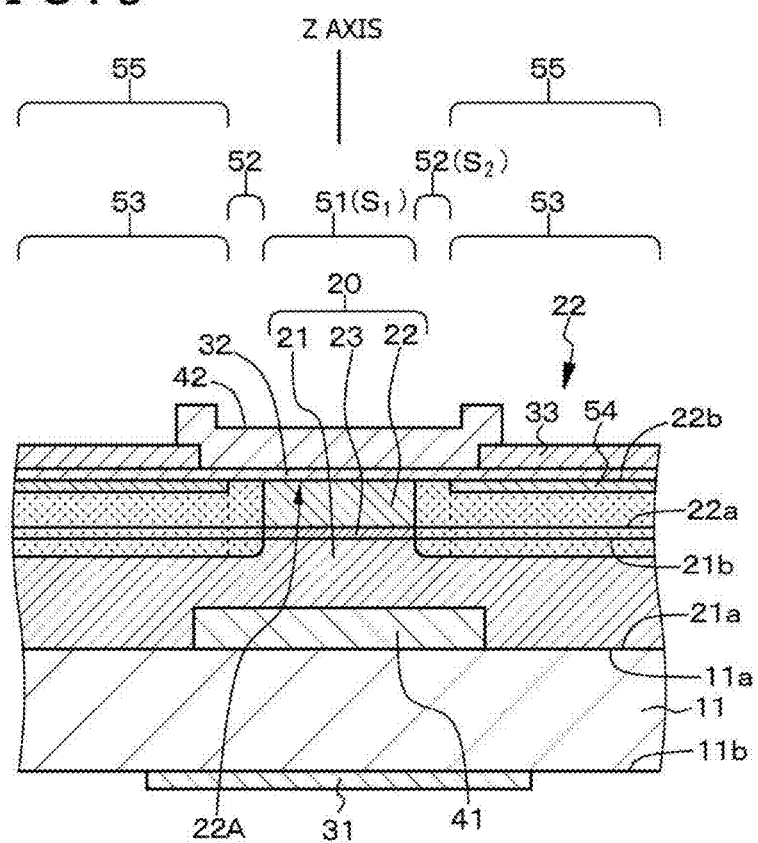
FIG. 5 is a schematic partial sectional view of a light emitting element of a working example 4.
Figure 6:
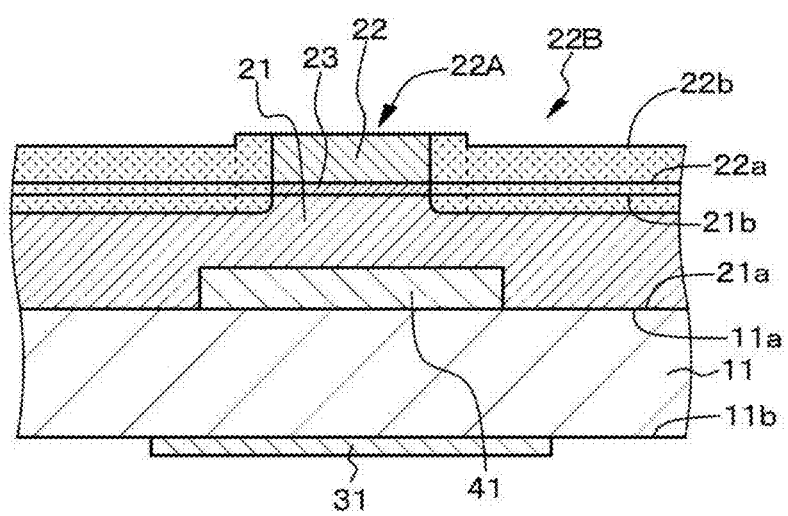
FIG. 6 is a schematic partial sectional view in which part of the light emitting element of the working example 4 depicted in FIG. 5 is cut out.

The working example 4 is a modification to the working examples 1 to 3 and relates to a light emitting element according to the 1-Dth mode of the present disclosure. As depicted in FIG. 5 that is a schematic partial sectional view of the light emitting element of the working example 4 and FIG. 6 that is a schematic partial sectional view with principal elements cut out, a projecting portion 22A is formed on the second face 22b side of the second compound semiconductor layer 22. Further, as depicted in FIGS. 5 and 6, the mode loss acting portion (mode loss acting layer) 54 is formed on a region 22B of the second face 22b of the second compound semiconductor layer 22 surrounding the projecting portion 22A. The projecting portion 22A occupies the current injection region 51 or the current injection region 51 and the current non-injection inner side region 52. The mode loss acting portion (mode loss acting layer) 54 is made of a dielectric material such as, for example, $SiO_2$ similarly as in the working example 1. In the region 22B, the current non-injection outer side region 53 is provided. Where the optical distance from the active layer 23 in the current injection region 51 to the second face of the second compound semiconductor layer 22 is represented by $L_2$ and the optical distance from the active layer 23 in the mode loss acting region 55 to the top face of the mode loss acting portion 54 (face opposing to the second electrode 32) is represented by $L_0$, $$L_0 < L_2$$

is satisfied. In particular, the optical distances $L_0$ and $L_2$ are set so as to satisfy $$L_2/L_0=1.5.$$

By the configuration, a lens effect is generated in the light emitting element.

In the light emitting element of the working example 4, generated laser light having a higher mode is confined to the current injection region 51 and the current non-injection inner side region 52 by the mode loss acting region 55, and consequently, the oscillation mode loss decreases. In particular, the light field intensities of the generated basic mode and higher mode increase in a projection image of the current injection region 51 and the current non-injection inner side region 52 due to the presence of the mode loss acting region 55 that acts upon increase or decrease of the oscillation mode loss.

In the working example 4, the shape of the boundary between the current injection region 51 and the current non-injection inner side region 52 was made a circular shape (diameter: 8 μm) and the shape of the boundary between the current non-injection inner side region 52 and the current non-injection outer side region 53 was made a circular shape (diameter: 30 μm).

In the working example 4, the projecting portion 22A may be formed by removing part of the second compound semiconductor layer 22 from the second face 22b side between the [step 120] and the [step 130] in the working example 1.

Except the foregoing, the components and structure of the light emitting element of the working example 4 can be made similar to the components and structure of the light emitting element of the working example 1, and therefore, detailed description of them is omitted herein. In the light emitting element of the working example 4, the oscillation mode loss provided by the mode loss acting region to various modes is suppressed to allow a lateral mode to be oscillated in a multimode and allow the threshold value of laser oscillation to be reduced. Further, as depicted in a conceptual view of (C) of FIG. 11, the light field intensity of the generated basic mode and higher mode can be increased in a projection image of the current injection region and the current non-injection inner side region due to the presence of the mode loss acting region that acts upon increase or decrease (in particular, in the working example 4, decrease) of the oscillation mode loss.

Working Example 5

The working example 5 is a modification to the working examples 1 to 4. The light emitting element of the working example 5 or of the working example 6 hereinafter described is configured from a surface emission laser element (vertical resonator laser, VCSEL) that emits laser light from the top face of the first compound semiconductor layer 21 through the first light reflection layer 41.

Figure 7:
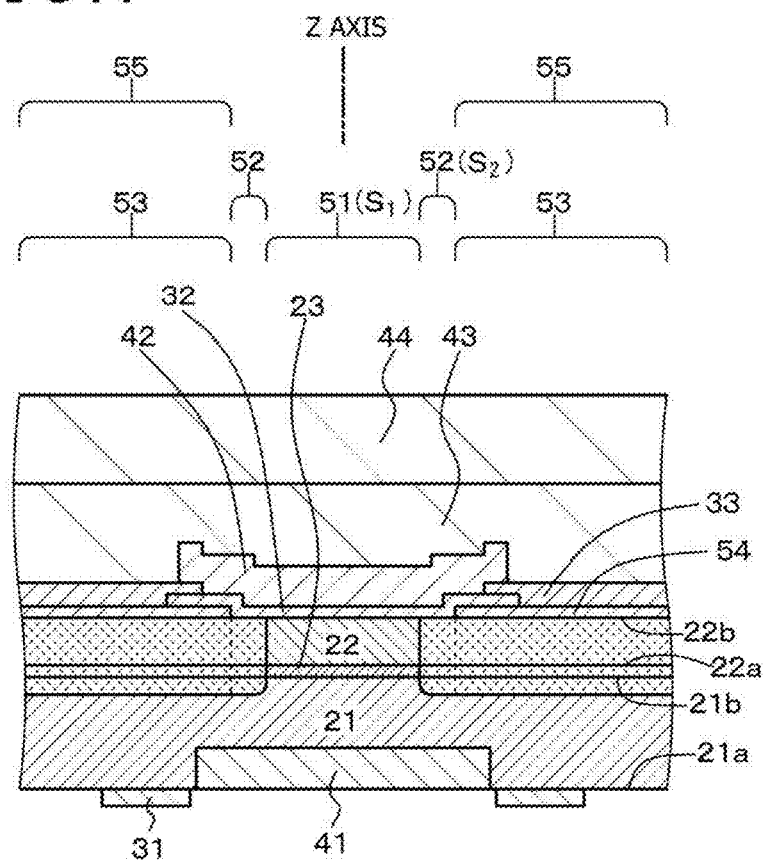
FIG. 7 is a schematic partial sectional view of a light emitting element of a working example 5.

In the light emitting element of the working example 5, as depicting in FIG. 7 that is a schematic partial sectional view, the second light reflection layer 42 is fixed to a support substrate 44, which is configured from a silicon semiconductor substrate, through a bonding layer 43, which is formed from a gold (Au) layer or a solder layer containing tin (Sn), by a soldering method.

In the following, a fabrication method of the light emitting element of the working example 5 is described.

[Step 500]

First, the state depicted in FIG. 1 can be obtained, for example, by steps similar to the [step 100] to [step 140] in the working example 1. Alternatively, the various fabrication steps for a light emitting element described hereinabove in connection with the working examples 2 to 4 are executed.

[Step 510]

Thereafter, the second light reflection layer 42 is fixed to the support substrate 44 through the bonding layer 43.

[Step 520]

Then, the light emitting element fabrication substrate 11 is removed to expose the first face 21a of the first compound semiconductor layer 21 and the first light reflection layer 41. In particular, the thickness of the light emitting element fabrication substrate 11 is reduced first by a mechanical polishing method, and then the remaining part of the light emitting element fabrication substrate 11 is removed by a CMP method. The first face 21a of the first compound semiconductor layer 21 and the first light reflection layer 41 are exposed in this manner.

[Step 530]

Thereafter, a first electrode 31 is formed on the first face 21a of the first compound semiconductor layer 21. The light emitting element of the working example 5 having the structure depicted in FIG. 7 can be obtained in this manner.

Also in the light emitting element of the working example 5, by arranging the current injection region, current non-injection region and mode loss acting region in a predetermined arrangement relationship, the relationship in magnitude of oscillation mode losses to be provided by the mode loss acting region to the basic mode and the higher mode can be controlled, and by making the oscillation mode loss provided to the higher mode relatively great with respect to the oscillation mode loss provided to the basic mode, the basic mode can be stabilized further.

In fabrication of the light emitting element of the working example 5, the light emitting element fabrication substrate is removed in a state in which the first light reflection layer remains formed. Therefore, since the first light reflection layer functions as a kind of stopper upon removal of the light emitting element fabrication substrate, occurrence of removal dispersion of the light emitting element fabrication substrate in the light emitting element fabrication substrate plane and thickness dispersion of the first compound semiconductor layer can be suppressed, and uniformization in length of the resonators can be anticipated. As a result, stabilization of a characteristic of the resulting light emitting element can be achieved. Besides, since the face of the first compound semiconductor layer (flattened face) in the interface between the first light reflection layer and the first compound semiconductor layer is flattened, scattering of laser light from the flattened face can be minimized.

In the example of the light emitting element described above and depicted in FIG. 7, an end portion of the first electrode 31 is spaced from the first light reflection layer 41. In other words, the first light reflection layer 41 and the first electrode 31 are spaced from each other and, in other words, have an offset therebetween, and the spaced distance is within 1 mm, more particularly, for example, 0.05 mm in average. However, the light emitting element is not limited to that of such a structure as just described above, but the end portion of the first electrode 31 may contact with the first light reflection layer 41 or the end portion of the first electrode 31 may be formed over an edge portion of the first light reflection layer 41.

Figure 8:
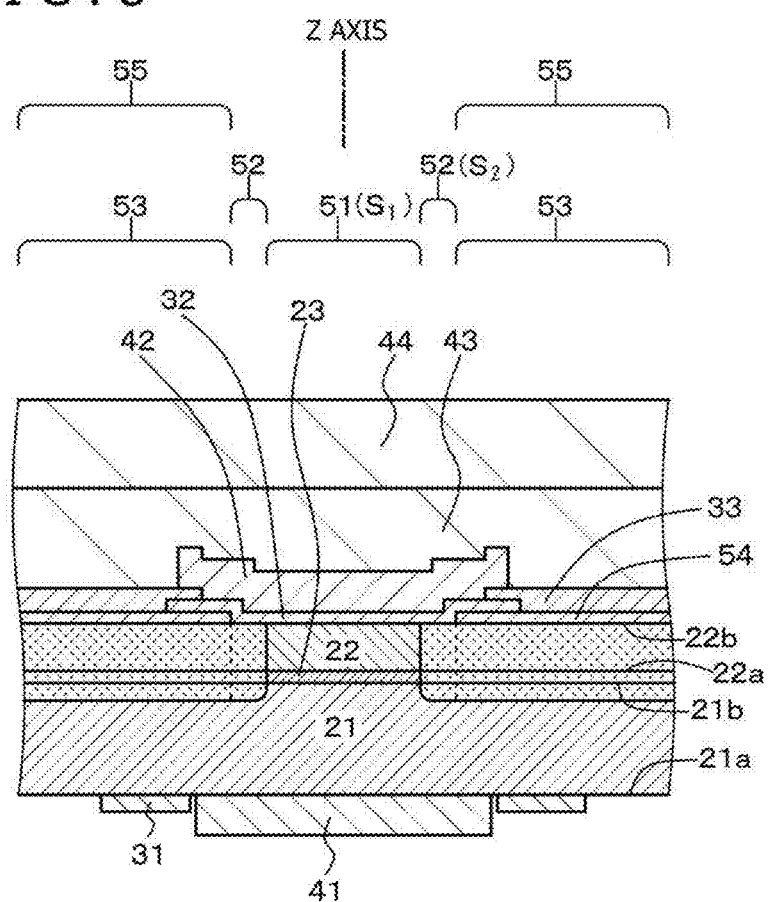
FIG. 8 is a schematic partial sectional view of a modification to the light emitting element of the working example 5.
Figure 9:
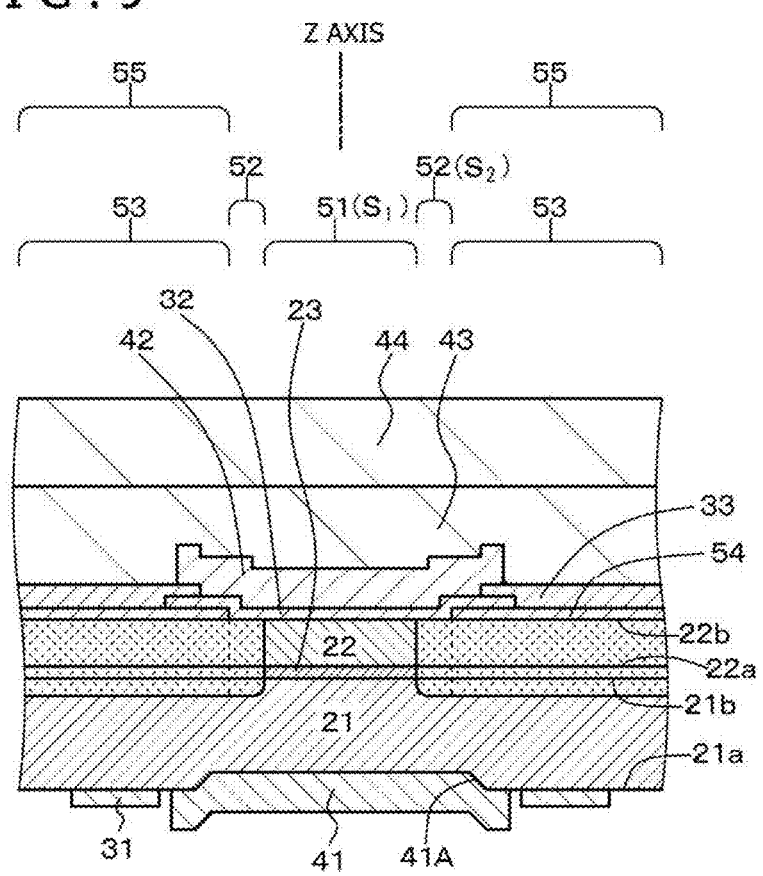
FIG. 9 is a schematic partial sectional view of a different modification to the light emitting element of the working example 5.

Further, after steps similar, for example, to the [step 110] to [step 140] of the working example 1 are executed first with the [step 100] in the working example 1 omitted, the [step 510] and the [step 520] may be executed to expose the first face 21a of the first compound semiconductor layer 21, whereafter the first light reflection layer 41 and the first electrode 31 are formed on the first face 21a of the first compound semiconductor layer 21. A schematic partial sectional view of a light emitting element obtained in this manner is depicted in FIG. 8. Alternatively, when the first light reflection layer 41 is formed on the first face 21a of the first compound semiconductor layer 21, the first compound semiconductor layer 21 may be etched to form a recessed portion on the first face 21a of the first compound semiconductor layer 21 such that the first light reflection layer 41 is formed in the recessed portion. Further, in this case, if the side wall of the recessed portion is forwardly tapered, then a light emitting element according to the 1-C'th mode of the present disclosure can be obtained (refer to FIG. 9). In other words, the first light reflection layer 41 has a region (inclined portion 41A) that reflects or scatters light from the second light reflection layer 42 toward the outer side of the resonator structure configured from the first light reflection layer 41 and the second light reflection layer 42.

Working Example 6

The working example 6 relates to a light emitting element according to the second mode of the present disclosure, more particularly, to a light emitting element according to the 2-Ath mode of the present disclosure. More specifically, the light emitting element of the working example 6 includes a surface emission laser element (vertical resonator laser, VCSEL) that emits laser light from the top face of a first compound semiconductor layer 21 through a first light reflection layer 41.

Figure 10:
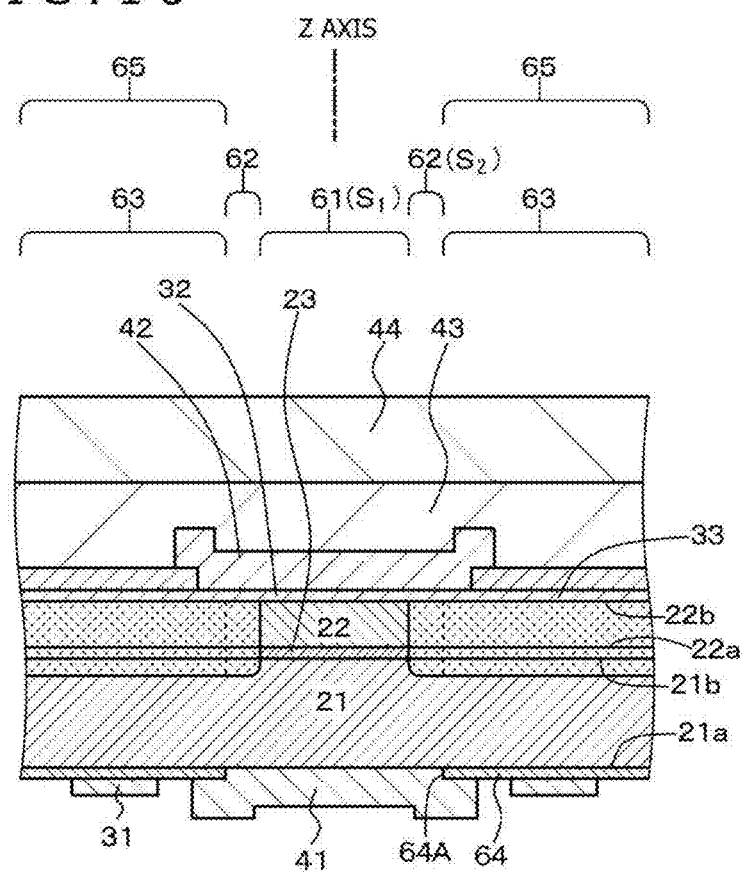
FIG. 10 is a schematic partial sectional view of a light emitting element of a working example 6.

The light emitting element of the working example 6 whose schematic partial end view is depicted in FIG. 10 includes:

(a) a stacked structure 20 in which
a first compound semiconductor layer 21 made of a GaN-based compound semiconductor and having a first face 21a and a second face 21b that opposes to the first face 21a,
an active layer (light emitting layer) 23 made of a GaN-based compound semiconductor and contacting with the second face 21b of the first compound semiconductor layer 21, and
a second compound semiconductor layer 22 made of a GaN-based compound semiconductor, having a first face 22a and a second face 22b that opposes to the first face 22a and contacting at the first face 22a thereof with the active layer 23
are stacked;

(b) a second electrode 32 formed on the second face 22b of the second compound semiconductor layer 22;

(c) a second light reflection layer 42 formed on the second electrode 32;

(d) a mode loss acting portion 64 provided on the first face 21a of the first compound semiconductor layer 21 and configuring a mode loss acting region 65 that acts upon increase or decrease of oscillation mode loss;

(e) a first light reflection layer 41 formed over a region from the first face 21a of the first compound semiconductor layer 21 to the mode loss acting portion 64; and (f) a first electrode 31 electrically connected to the first compound semiconductor layer 21. It is to be noted that, in the light emitting element of the working example 6, the first electrode 31 is formed on the first face 21a of the first compound semiconductor layer 21.

Thus, on the stacked structure 20, a current injection region 61, a current non-injection inner side region 62 surrounding the current injection region 61 and a current non-injection outer side region 63 surrounding the current non-injection inner side region 62 are formed, and a projection image of the mode loss acting region 65 and a projection image of the current non-injection outer side region 63 overlap with each other. Here, although the current non-injection regions 62 and 63 are formed on the stacked structure 20, in the example depicted, they are formed over a region from the second compound semiconductor layer 22 to part of the first compound semiconductor layer 21 in the thicknesswise direction. However, the current non-injection regions 62 and 63 may be formed in a region at the second electrode side of the second compound semiconductor layer 22 in the thicknesswise direction or may be formed over the overall second compound semiconductor layer 22 or else may be formed on the second compound semiconductor layer 22 and the active layer 23.

The configuration of the stacked structure 20, pad electrode 33, first light reflection layer 41 and second light reflection layer 42 may be similar to that in the working example 1, and the configuration of the bonding layer 43 and the support substrate 44 can be made similar to that in the working example 5. A circular opening 64A is formed at the mode loss acting portion 64, and the first face 21a of the first compound semiconductor layer 21 is exposed to the bottom of the opening 64A.

The mode loss acting portion (mode loss acting layer) 64 is formed from a dielectric material such as $SiO_2$ and is formed on the first face 21a of the first compound semiconductor layer 21. The optical thickness of the mode loss acting portion 64 can be set to a value displaced from an integer multiple of one fourth the wavelength of light generated by the light emitting element. Alternatively, also it is possible to set the optical thickness of the mode loss acting portion 64 to an integer multiple of one fourth the wavelength of light generated from the light emitting element. In other words, the optical thickness of the mode loss acting portion 64 can be set to such a thickness that the phase of light generated from the light emitting element is not disturbed and the standing wave is not destroyed. However, the optical thickness of the mode loss acting portion 64 need not strictly be an integer multiple of one fourth, but may satisfy $$(\lambda/4n_0) \times m - (\lambda/8n_0) \leq t_0 \leq (\lambda/4n_0) \times 2m + (\lambda/8n_0)$$

In particular, where the value of one fourth the wavelength of light generated by the light emitting element is "100," preferably the optical thickness of the mode loss acting portion 64 is approximately 25 to 250. Further, by adopting the configurations described above, the phase difference between laser light that passes the mode loss acting portion 64 and laser light that passes the current injection region 61 can be changed (the phase difference can be controlled), and the control of the oscillation mode loss can be performed with a still higher degree of freedom and the degree of freedom in design of the light emitting element can be increased further.

In the working example 6, the shape of the boundary between the current injection region 61 and the current non-injection inner side region 62 was made a circular shape (diameter: 8 μm) and the shape of the boundary between the current non-injection inner side region 62 and the current non-injection outer side region 63 was made a circular shape (diameter: 15 μm). In particular, where the area of a projection image of the current injection region 61 is represented by $S_1'$ and the area of a projection image of the current non-injection inner side region 62 is represented by $S_2'$, $$0.01 \le S_1'/(S_1'+S_2') \le 0.7$$

is satisfied. In particular, $$S_1'/(S_1'+S_2') = 8^2/15^2 = 0.28$$

is satisfied.

In the light emitting element of the working example 6, where the optical distance from the active layer 23 in the current injection region 61 to the first face of the first compound semiconductor layer 21 is represented by $L_1'$ and the optical distance from the active layer 23 in the mode loss acting region 65 to the top face of the mode loss acting portion 64 (face opposing to the first electrode 31) is represented by $L_0'$, $$L_0' > L_1'$$

is satisfied. In particular, the distances are set so as to satisfy $$L_0'/L_1' = 1.01.$$

Thus, generated laser light having a higher mode is dissipated toward the outer side of the resonator structure configured from the first light reflection layer 41 and the second light reflection layer 42 by the mode loss acting region 65, whereby the oscillation mode loss increases. In particular, although the light field intensity of the generated basic mode and higher mode decreases, due to the presence of the mode loss acting region 65 that acts upon increase or decrease of the oscillation mode loss, as the distance from the Z axis increases in the projection image of the mode loss acting region 65 (refer to a conceptual view of (B) of FIG. 11), the decrease of the light field intensity of the higher mode is greater than the decrease of the light field intensity of the basic mode. Consequently, the basic mode can be stabilized further and reduction of the threshold value current can be achieved, and the relative light field intensity of the basic mode can be increased.

In the light emitting element of the working example 6, the current non-injection inner side region 62 and the current non-injection outer side region 63 are formed by ion injection into the stacked structure 20 similarly as in the working example 1. Although, for example, boron was selected as the ion species, the ion species is not limited to the boron ion.

In the following, a fabrication method of the light emitting element of the working example 6 is described.

[Step 600]

First, on a light emitting element fabrication substrate 11, a stacked structure 20 including a first compound semiconductor layer 21 made of a GaN-based compound semiconductor and having a first face 21a and a second face 21b that opposes to the first face 21a, an active layer (light emitting layer) 23 made of a GaN-based compound semiconductor and contacting with the second face 21b of the first compound semiconductor layer 21, and a second compound semiconductor layer 22 made of a GaN-based compound semiconductor, having a first face 22a and a second face 22b that opposes to the first face 22a and contacting at the first face 22a thereof with the active layer 23 stacked thereon is formed. In particular, the stacked structure 20 can be obtained by forming a first compound semiconductor layer 21 made of n-GaN by lateral growth using a method for epitaxial growth in a lateral direction such as an ELO method and further forming an active layer 23 and a second compound semiconductor layer 22 by an epitaxial growth method on the first compound semiconductor layer 21.

[Step 610]

Thereafter, a current non-injection inner side region 62 and a current non-injection outer side region 63 are formed on the stacked structure 20 by an ion injection method in which boron ions are used.

[Step 620]

Then, on the second face 22b of the second compound semiconductor layer 22, a second electrode 32 is formed, for example, by a liftoff method, and further, a pad electrode 33 is formed by a known method. Thereafter, a second light reflection layer 42 is formed by a known method over an area from the second electrode 32 to the pad electrode 33.

[Step 630]

Thereafter, the second light reflection layer 42 is fixed to the support substrate 44 through a bonding layer 43.

[Step 640]

Then, the light emitting element fabrication substrate 11 is removed to expose the first face 21a of the first compound semiconductor layer 21. In particular, the thickness of the light emitting element fabrication substrate 11 is reduced first by a mechanical polishing method, and then the remaining part of the light emitting element fabrication substrate 11 is removed by a CMP method. The first face 21a of the first compound semiconductor layer 21 is exposed in this manner.

[Step 650]

Thereafter, a mode loss acting portion (mode loss acting layer) 64 made of $SiO_2$ and having an opening 64A is formed on the first face 21a of the first compound semiconductor layer 21 by a known method.

[Step 660]

Thereafter, a first light reflection layer 41 formed from a multilayer film is formed over an area from the first face 21a of the first compound semiconductor layer 21 exposed to the bottom of the opening 64A of the mode loss acting portion 64 to the mode loss acting portion 64, and a first electrode 31 is formed further. The light emitting element of the working example 6 having the structure depicted in FIG. 10 can be obtained in this manner.

[Step 670]

Thereafter, so-called element separation is performed to separate the light emitting element, and a side face and an exposed face of the stacked structure are coated with an insulating film made of, for example, $SiO_2$. Then, packaging or sealing is performed to complete the light emitting element of the working example 6.

Also in the light emitting element of the working example 6, the stacked structure has formed thereon a current injection region, a current non-injection inner side region that surrounds the current injection region and a current non-injection outer side region that surrounds the current non-injection inner side region, and a projection image of the mode loss acting region and a projection image of the current non-injection outer side region overlap with each other. Therefore, increase or decrease (in particular, in the working example 6, increase) of the oscillation mode loss can be set to a desired state as depicted in a conceptual view of (B) of FIG. 11. Besides, since control of the oscillation mode loss and control of the light emission state of the light emitting element can be performed independently of each other, the degree of freedom in control and the degree of freedom in design of the light emitting element can be enhanced. In particular, by setting the current injection region, current non-injection inner side region and mode loss acting region to the predetermined arrangement relationship described above, the relationship in magnitude of the oscillation mode loss provided by the mode loss acting region to the basic mode and a higher mode can be controlled, and by making the oscillation mode loss provided to a higher mode relatively greater than oscillation mode loss provided to the basic mode, the basic mode can be stabilized still more. Further, also it is possible to achieve reduction of the influence of an inverse lens effect.

Also in the working example 6, similarly as in the working example 2, the current non-injection inner side region 62 and the current non-injection outer side region 63 are formed by plasma irradiation upon the second face of the second compound semiconductor layer 22, an ashing process for the second face of the second compound semiconductor layer 22 or a reactive ion etching (RIE) process for the second face of the second compound semiconductor layer 22 (light emitting element according to the 2-Bth mode of the present disclosure). By exposing the current non-injection inner side region 62 and the current non-injection outer side region 63 to plasma particles in this manner, degradation of the conductivity of the second compound semiconductor layer 22 occurs, and the current non-injection inner side region 62 and the current non-injection outer side region 63 are placed into a high resistance state. In other words, the current non-injection inner side region 62 and the current non-injection outer side region 63 are formed by exposure of the second face 22b of the second compound semiconductor layer 22 to plasma particles.

Further, similarly as in the working example 3, also it is possible to configure the second light reflection layer 42 such that it has a region that reflects or scatters light from the first light reflection layer 41 toward the outer side of the resonator structure configured from the first light reflection layer 41 and the second light reflection layer 42 (namely, toward the mode loss acting region 65) (light emitting element according to the 2-Cth mode of the present disclosure). Alternatively, similarly as in the working example 5, when the first light reflection layer 41 is formed on the first face 21a of the first compound semiconductor layer 21, the first compound semiconductor layer 21 may be etched to form, on the first face 21a of the first compound semiconductor layer 21, a recessed portion in which the first light reflection layer 41 is to be formed and which has a forwardly inclined tapering shape (light emitting element according to the 2-C'th mode of the present disclosure).

Further, similarly as in the working example 4, a projecting portion may be formed at the first face 21a side of the first compound semiconductor layer 21 while the mode loss acting portion (mode loss acting layer) 64 is formed on a region of the first face 21a of the first compound semiconductor layer 21 surrounding the projecting portion (light emitting element according to the 2-Dth mode of the present disclosure). The mode loss acting portion (mode loss acting layer) 64 may be formed on the region of the first face 21a of the first compound semiconductor layer 21 surrounding the projecting portion. The projecting portion occupies the current injection region 61 or the current injection region 61 and the current non-injection inner side region 62. And by this, generated laser light having a higher mode is confined in the current injection region 61 and the current non-injection inner side region 62 by the mode loss acting region 65, and consequently, the oscillation mode loss decreases. In particular, the light field intensity of the basic mode and the higher mode to be generated increases in a projection image of the current injection region 61 and the current non-injection inner side region 62 due to the presence of the mode loss acting region 65 that acts upon increase or decrease of the oscillation mode loss. Also in a modification to the light emitting element of the working example 6 having such a configuration as described above, it is possible to suppress the oscillation mode loss provided by the mode loss acting region 65 to various modes thereby to not only allow a lateral mode to be oscillated in multi modes but also reduce the threshold value for laser oscillation. Further, the light field intensity of the generated basic mode and higher mode can be increased in a projection image of the current injection region and the current non-injection inner side region as depicted in a conceptual view of (C) of FIG. 11 due to the presence of the mode loss acting region 65 that acts upon increase or decrease of the oscillation mode loss (particularly, in the modification to the light emitting element of the working example 6, upon decrease).

In some cases, a projecting portion (mesa structure) may be formed at the first face 21a side of the first compound semiconductor layer 21 such that a region of the first compound semiconductor layer 21 surrounding the projecting portion is formed as a mode loss acting region (mode loss acting portion). In particular, in this case, formation of the mode loss acting layer may be omitted while the mode loss acting portion is formed from a region of the first compound semiconductor layer surrounding the projecting portion. Then, the first light reflection layer 41 may be formed on the top face of the projecting portion. The projecting portion occupies the current injection region 61 or the current injection region 61 and the current non-injection inner side region 62. Also by this, generated laser light having a high mode is confined to the current injection region 61 and the current non-injection inner side region 62 by the mode loss acting region, and the oscillation mode loss decreases thereby. In particular, the light field intensity of the generated basic mode and higher mode increases in a projection image of the current injection region 61 and the current non-injection inner side region 62 due to the presence of the mode loss acting region that acts upon increase or decrease of the oscillation mode loss. Also in the modification to the light emitting element of the working example 6 having such a configuration as described above, it is possible to suppress the oscillation mode loss provided by the mode loss acting region to various modes to not only allow a lateral mode to be oscillated in multi modes and but also reduce the threshold value for laser oscillation. Further, as depicted in a conceptual view of (C) of FIG. 11, the light field intensity of a generated basic mode and higher mode can be increased in a projection image of the current injection region and the current non-injection inner side region due to the presence of the mode loss acting region that acts upon increase or decrease of the oscillation mode loss (in particular, in the modification to the light emitting element of the working example 6, upon decrease).

Although the present disclosure is described above on the basis of preferred modes, the present disclosure is not limited to the embodiments. The configuration and structure of the light emitting elements described in connection with the embodiments are exemplary and can be suitably changed, and also the fabrication methods for a light emitting element can be suitably changed. In some cases, a surface emission laser element that emits light from the top face of the second compound semiconductor layer through the second light reflection layer can be formed by appropriately selecting a bonding layer or a support substrate. By removing the support substrate after the first light reflection layer and the first electrode are formed, also it is possible to complete a surface emission laser element that emits light from the top face of the second compound semiconductor layer through the second light reflection layer. Alternatively, by fixing the first light reflection layer to the second support substrate and then removing the support substrate to expose the second light reflection layer, also it is possible to complete the surface emission laser element that emits light from the top face of the second compound semiconductor layer through the second light reflection layer.

It is to be noted that the present disclosure can take the following configurations.

[A01] <<Light Emitting Element: First Mode>>

A light emitting element, including:

(A) a stacked structure configured by stacking a first compound semiconductor layer made of a GaN-based compound semiconductor and having a first face and a second face that opposes to the first face, an active layer made of a GaN-based compound semiconductor and contacting with the second face of the first compound semiconductor layer, and a second compound semiconductor layer made of a GaN-based compound semiconductor, having a first face and a second face that opposes to the first face and contacting at the first face thereof with the active layer;

(B) a mode loss acting portion provided on the second face of the second compound semiconductor layer and configuring a mode loss acting region that acts upon increase or decrease of oscillation mode loss;

(C) a second electrode formed over a region from the second face of the second compound semiconductor layer to the mode loss acting portion;

(D) a second light reflection layer formed on the second electrode;

(E) a first light reflection layer formed on the first face of the first compound semiconductor layer; and (F) a first electrode electrically connected to the first compound semiconductor layer, in which a current injection region, a current non-injection inner side region that surrounds the current injection region and a current non-injection outer side region that surrounds the current non-injection inner side region are formed on the stacked structure, and a projection image of the mode loss acting region and a projection image of the current non-injection outer side region overlap with each other.

[A02] The light emitting element according to [A01], in which the current non-injection outer side region is positioned below the mode loss acting region.

[A03] The light emitting element according to [A01] or [A02], in which, where an area of the projection image of the current injection region is represented by $S_1$ and an area of the projection image of the current non-injection inner side region is represented by $S_2$, $$0.01 \leq S_1/(S_1+S_2) \leq 0.7$$

is satisfied.

[A04] The light emitting element according to any one of [A01] to [A03], in which the current non-injection inner side region and the current non-injection outer side region are formed by ion injection into the stacked structure.

[A05] The light emitting element according to [A04], in which an ion species is ion of at least one selected from a group including boron, proton, phosphorus, arsenic, carbon, nitrogen, fluorine, oxygen, germanium and silicon.

[A06] The light emitting element according to any one of [A01] to [A05], in which the current non-injection inner side region and the current non-injection outer side region are formed by plasma irradiation upon the second face of the second compound semiconductor layer, an ashing process for the second face of the second compound semiconductor layer or a reactive ion etching process for the second face of the second compound semiconductor layer.

[A07] The light emitting element according to any one of [A01] to [A06], in which the second light reflection layer has a region that reflects or scatters light from the first light reflection layer toward the outer side of a resonator structure configured from the first light reflection layer and the second light reflection layer.

[A08] The light emitting element according to any one of [A04] to [A07], in which, where an optical distance from the active layer in the current injection region to the second face of the second compound semiconductor layer is represented by $L_2$ and an optical distance from the active layer in the mode loss acting region to a top face of the mode loss acting portion is represented by $L_0$, $$L_0 > L_2$$

is satisfied.

[A09] The light emitting element according to any one of [A04] to [A08], in which generated light having a higher mode is dissipated toward the outer side of the resonator structure, which is configured from the first light reflection layer and the second light reflection layer, by the mode loss acting region, whereby oscillation mode loss increases.

[A10] The light emitting element according to any one of [A04] to [A09], in which the mode loss acting portion is made of a dielectric material, a metal material or an alloy material.

[A11] The light emitting element according to [A10], in which the mode loss acting portion is made of a dielectric material, and an optical thickness of the mode loss acting portion is a value displaced from an integer multiple of one fourth a wavelength of light generated by the light emitting element.

[A12] The light emitting element according to [A10], in which the mode loss acting portion is made of a dielectric material, and an optical thickness of the mode loss acting portion is an integer multiple of one fourth a wavelength of light generated by the light emitting element.

[A13] The light emitting element according to any one of [A01] to [A03], in which a projecting portion is formed at the second face side of the second compound semiconductor layer, and the mode loss acting portion is formed on a region of the second face of the second compound semiconductor layer surrounding the projecting portion.

[A14] The light emitting element according to [A13], in which, where an optical distance from the active layer in the current injection region to the second face of the second compound semiconductor layer is represented by $L_2$ and an optical distance from the active layer in the mode loss acting region to the top of the mode loss acting portion is represented by $L_0$, $$L_0 < L_2$$

is satisfied.

[A15] The light emitting element according to [A13] or [A14], in which generated light having a higher mode is confined to the current injection region and the current non-injection inner side region by the mode loss acting region, whereby oscillation mode loss decreases.

[A16] The light emitting element according to any one of [A13] to [A15], in which the mode loss acting portion is made of a dielectric material, a metal material or an alloy material.

[A17] The light emitting element according to any one of [A01] to [A16], in which the second electrode is made of a transparent conductive material.

[B01] <<Light Emitting Element: Second Mode>>

A light emitting element, including:

(a) a stacked structure configured by stacking a first compound semiconductor layer made of a GaN-based compound semiconductor and having a first face and a second face that opposes to the first face, an active layer made of a GaN-based compound semiconductor and contacting with the second face of the first compound semiconductor layer, and a second compound semiconductor layer made of a GaN-based compound semiconductor, having a first face and a second face that opposes to the first face and contacting at the first face thereof with the active layer;

(b) a second electrode formed on the second face of the second compound semiconductor layer;

(c) a second light reflection layer formed on the second electrode;

(d) a mode loss acting portion provided on the first face of the first compound semiconductor layer and configuring a mode loss acting region that acts upon increase or decrease of oscillation mode loss;

(e) a first light reflection layer formed over a region from the first face of the first compound semiconductor layer to the mode loss acting portion; and (f) a first electrode electrically connected to the first compound semiconductor layer, in which a current injection region, a current non-injection inner side region that surrounds the current injection region and a current non-injection outer side region that surrounds the current non-injection inner side region are formed on the stacked structure, and a projection image of the mode loss acting region and a projection image of the current non-injection outer side region overlap with each other.

[B02] The light emitting element according to [B01], in which, where an area of the projection image of the current injection region is represented by $S_1$ and an area of the projection image of the current non-injection inner side region is represented by $S_2$, $$0.01 \leq S_1/(S_1+S_2) \leq 0.7$$

is satisfied.

[B03] The light emitting element according to [B01] or [B02], in which the current non-injection inner side region and the current non-injection outer side region are formed by ion injection into the stacked structure.

[B04] The light emitting element according to [B03], in which an ion species is ion of at least one selected from a group including boron, proton, phosphorus, arsenic, carbon, nitrogen, fluorine, oxygen, germanium and silicon.

[B05] The light emitting element according to any one of [B01] to [B04], in which the current non-injection inner side region and the current non-injection outer side region are formed by plasma irradiation upon the second face of the second compound semiconductor layer, an ashing process for the second face of the second compound semiconductor layer or a reactive ion etching process for the second face of the second compound semiconductor layer.

[B06] The light emitting element according to any one of [B01] to [B05], in which the second light reflection layer has a region that reflects or scatters light from the first light reflection layer toward the outer side of a resonator structure configured from the first light reflection layer and the second light reflection layer.

[B07] The light emitting element according to any one of [B03] to [B06], in which, where an optical distance from the active layer in the current injection region to the first face of the first compound semiconductor layer is represented by $L_1'$ and an optical distance from the active layer in the mode loss acting region to a top face of the mode loss acting portion is represented by $L_0'$, $$L_0' > L_1'$$

is satisfied.

[B08] The light emitting element according to any one of [B03] to [B07], in which generated light having a higher mode is dissipated toward the outer side of the resonator structure, which is configured from the first light reflection layer and the second light reflection layer, by the mode loss acting region, whereby oscillation mode loss increases.

[B09] The light emitting element according to any one of [B03] to [B08], in which the mode loss acting portion is made of a dielectric material, a metal material or an alloy material.

[B10] The light emitting element according to [B09], in which the mode loss acting portion is made of a dielectric material, and an optical thickness of the mode loss acting portion is a value displaced from an integer multiple of one fourth a wavelength of light generated by the light emitting element.

[B11] The light emitting element according to [B09], in which the mode loss acting portion is made of a dielectric material, and an optical thickness of the mode loss acting portion is an integer multiple of one fourth a wavelength of light generated by the light emitting element.

[B12] The light emitting element according to [B01] or [B02], in which a projecting portion is formed at the first face side of the first compound semiconductor layer, and the mode loss acting portion is formed on a region of the first face of the first compound semiconductor layer surrounding the projecting portion.

[B13] The light emitting element according to [B12], in which, where an optical distance from the active layer in the current injection region to the first face of the first compound semiconductor layer is represented by $L_1'$ and an optical distance from the active layer in the mode loss acting region to the top of the mode loss acting portion is represented by $L_0'$, $$L_0' < L_1'$$

is satisfied.

[B14] The light emitting element according to [B01] or [B02], in which a projecting portion is formed at the first face side of the first compound semiconductor layer, and the mode loss acting portion is configured from a region of the first face of the first compound semiconductor layer surrounding the projecting portion.

[B15] The light emitting element according to any one of [B12] to [B14], in which generated light having a higher mode is confined to the current injection region and the current non-injection inner side region by the mode loss acting region, whereby oscillation mode loss decreases.

[B16] The light emitting element according to any one of [B12] to [B15], in which the mode loss acting portion is made of a dielectric material, a metal material or an alloy material.

[B17] The light emitting element according to any one of [B01] to [B16], in which the second electrode is made of a transparent conductive material.

REFERENCE SIGNS LIST

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

11 . . . Light emitting element fabrication substrate, 11a . . . First face of light emitting element fabrication substrate, 11b . . . Second face of light emitting element fabrication substrate, 20 . . . Stacked structure, 21 . . . First compound semiconductor layer, 21a . . . First face of first compound semiconductor layer, 21b . . . Second face of first compound semiconductor layer, 22 . . . Second compound semiconductor layer, 22a . . . First face of second compound semiconductor layer, 22b . . . Second face of second compound semiconductor layer, 22A . . . Convex portion, 22B . . . Region of second face of second compound semiconductor layer surrounding projecting portion, 23 . . . Active layer (light emitting layer), 31 . . . First electrode, 32 . . . Second electrode, 33 . . . Pad electrode, 41 . . . First light reflection layer, 41A . . . Forwardly tapering inclined portion formed on first light reflection layer, 42 . . . Second light reflection layer, 42A . . . Forwardly tapering inclined portion formed on second light reflection layer, 43 . . . Bonding layer, 44 . . . Support substrate, 51, 61 . . . Current injection region, 52, 62 . . . Current non-injection inner side region, 53, 63 . . . Current non-injection outer side region, 54, 64 . . . Mode loss acting portion (mode loss acting layer), 54A, 54B, 64A . . . Opening formed at mode loss acting portion, 55, 65 . . . Mode loss acting region

The invention claimed is:

1. A light emitting element, comprising:
(A) a stacked structure configured by stacking
a first compound semiconductor layer made of a GaN-based compound semiconductor and having a first face and a second face that opposes to the first face,
an active layer made of a GaN-based compound semiconductor and contacting with the second face of the first compound semiconductor layer, and
a second compound semiconductor layer made of a GaN-based compound semiconductor, having a first face and a second face that opposes to the first face and contacting at the first face thereof with the active layer;
(B) a mode loss acting portion provided on the second face of the second compound semiconductor layer and configuring a mode loss acting region that acts upon increase or decrease of oscillation mode loss;
(C) a second electrode formed over a region from the second face of the second compound semiconductor layer to the mode loss acting portion;
(D) a second light reflection layer formed on the second electrode;
(E) a first light reflection layer formed on the first face of the first compound semiconductor layer; and
(F) a first electrode electrically connected to the first compound semiconductor layer,
wherein a current injection region, a current non-injection inner side region that surrounds the current injection region and a current non-injection outer side region that surrounds the current non-injection inner side region are formed on the stacked structure, and
a projection image of the mode loss acting region and a projection image of the current non-injection outer side region overlap with each other.

2. The light emitting element according to claim 1, wherein the current non-injection outer side region is positioned below the mode loss acting region.

3. The light emitting element according to claim 1, wherein, where an area of the projection image of the current injection region is represented by S1 and an area of the projection image of the current non-injection inner side region is represented by S2, $$0.01 \leq S1/(S1+S2) \leq 0.7$$

is satisfied.

4. The light emitting element according to claim 1, wherein the current non-injection inner side region and the current non-injection outer side region are formed by ion injection into the stacked structure.

5. The light emitting element according to claim 4, wherein an ion species is ion of at least one selected from a group including boron, proton, phosphorus, arsenic, carbon, nitrogen, fluorine, oxygen, germanium and silicon.

6. The light emitting element according to claim 1, wherein the current non-injection inner side region and the current non-injection outer side region are formed by plasma irradiation upon the second face of the second compound semiconductor layer, an ashing process for the second face of the second compound semiconductor layer or a reactive ion etching process for the second face of the second compound semiconductor layer.

7. The light emitting element according to claim 1, wherein the second light reflection layer has a region that reflects or scatters light from the first light reflection layer toward the outer side of a resonator structure configured from the first light reflection layer and the second light reflection layer.

8. The light emitting element according to claim 4, wherein, where an optical distance from the active layer in the current injection region to the second face of the second compound semiconductor layer is represented by L2 and an optical distance from the active layer in the mode loss acting region to a top face of the mode loss acting portion is represented by L0, $$L0 > L2$$

is satisfied.

9. The light emitting element according to claim 4, wherein generated light having a higher mode is dissipated toward the outer side of the resonator structure, which is configured from the first light reflection layer and the second light reflection layer, by the mode loss acting region, whereby oscillation mode loss increases.

10. The light emitting element according to claim 4, wherein the mode loss acting portion is made of a dielectric material, a metal material or an alloy material.

11. The light emitting element according to claim 10, wherein the mode loss acting portion is made of a dielectric material, and an optical thickness of the mode loss acting portion is a value displaced from an integer multiple of one fourth a wavelength of light generated by the light emitting element.

12. The light emitting element according to claim 10, wherein the mode loss acting portion is made of a dielectric material, and an optical thickness of the mode loss acting portion is an integer multiple of one fourth a wavelength of light generated by the light emitting element.

13. The light emitting element according to claim 1, wherein a projecting portion is formed at the second face side of the second compound semiconductor layer, and the mode loss acting portion is formed on a region of the second face of the second compound semiconductor layer surrounding the projecting portion.

14. The light emitting element according to claim 13, wherein, where an optical distance from the active layer in the current injection region to the second face of the second compound semiconductor layer is represented by L2 and an optical distance from the active layer in the mode loss acting region to the top of the mode loss acting portion is represented by L0, $$L0<L2$$

is satisfied.

15. The light emitting element according to claim 13, wherein generated light having a higher mode is confined to the current injection region and the current non-injection inner side region by the mode loss acting region, whereby oscillation mode loss decreases.

16. The light emitting element according to claim 13, wherein the mode loss acting portion is made of a dielectric material, a metal material or an alloy material.

17. The light emitting element according to claim 1, wherein the second electrode is made of a transparent conductive material.

18. A light emitting element, comprising:
(a) a stacked structure configured by stacking
a first compound semiconductor layer made of a GaN-based compound semiconductor and having a first face and a second face that opposes to the first face,
an active layer made of a GaN-based compound semiconductor and contacting with the second face of the first compound semiconductor layer, and
a second compound semiconductor layer made of a GaN-based compound semiconductor, having a first face and a second face that opposes to the first face and contacting at the first face thereof with the active layer;
(b) a second electrode formed on the second face of the second compound semiconductor layer;
(c) a second light reflection layer formed on the second electrode;
(d) a mode loss acting portion provided on the first face of the first compound semiconductor layer and configuring a mode loss acting region that acts upon increase or decrease of oscillation mode loss;
(e) a first light reflection layer formed over a region from the first face of the first compound semiconductor layer to the mode loss acting portion; and
(f) a first electrode electrically connected to the first compound semiconductor layer,
wherein a current injection region, a current non-injection inner side region that surrounds the current injection region and a current non-injection outer side region that surrounds the current non-injection inner side region are formed on the stacked structure, and
projection image of the mode loss acting region and a projection image of the current non-injection outer side region overlap with each other.

19. The light emitting element according to claim 18, wherein the current non-injection inner side region and the current non-injection outer side region are formed by ion injection into the stacked structure.

20. The light emitting element according to claim 18, wherein the current non-injection inner side region and the current non-injection outer side region are formed by plasma irradiation upon the second face of the second compound semiconductor layer, an ashing process for the second face of the second compound semiconductor layer or a reactive ion etching process for the second face of the second compound semiconductor layer.

* * * * *